United States Patent
DenBaars et al.

(10) Patent No.: US 9,130,119 B2
(45) Date of Patent: *Sep. 8, 2015

(54) NON-POLAR AND SEMI-POLAR LIGHT EMITTING DEVICES

(75) Inventors: Steven P. DenBaars, Goleta, AA (US); Mathew C. Schmidt, Santa Barbara, CA (US); Kwang Choong Kim, Seoul (KR); James S. Speck, Goleta, CA (US); Shuji Nakamura, Santa Barbara, CA (US)

(73) Assignees: The Regents of the University of California, Oakland, CA (US); Japan Science and Technology Agency, Saitama Prefecture (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/001,227

(22) Filed: Dec. 11, 2007

(65) Prior Publication Data

US 2008/0179607 A1 Jul. 31, 2008

Related U.S. Application Data

(60) Provisional application No. 60/869,540, filed on Dec. 11, 2006.

(51) Int. Cl.
 *H01L 33/00* (2010.01)
 *H01L 33/32* (2010.01)
 (Continued)

(52) U.S. Cl.
 CPC .............. *H01L 33/32* (2013.01); *B82Y 20/00* (2013.01); *H01L 33/06* (2013.01); *H01L 33/16* (2013.01);

(Continued)

(58) Field of Classification Search
 CPC ......... H01L 33/32; H01L 33/16; H01L 33/06; B82Y 20/00
 USPC ............... 257/94, E33.001, 79, E21.113, 257/E21.463, 13, 76, 80, 82, 88, 96, 97, 257/103; 438/46, 47, 479; 148/33
 See application file for complete search history.

(56) References Cited

U.S. PATENT DOCUMENTS

| 5,708,280 A | * | 1/1998 | Lebby et al. | 257/88 |
| 5,777,350 A | | 7/1998 | Nakamura et al. | |

(Continued)

FOREIGN PATENT DOCUMENTS

| JP | 11-135838 | 5/1999 |
| JP | 2002-176198 | 6/2002 |

(Continued)

OTHER PUBLICATIONS

Ashay Chitnis, Changqing Chen, Vinod Adivarahan, Maxim Shatalov, Edmundas Kuokstis, Vasavi Mandavilli, Jinwei Yang, M. Asif Khan; Visible light-emitting diodes using a-plane GaN-InGaN multiple quantum wells over r-plane sapphire; Applied Physics Letters; vol. 84 No. 18; May 3, 2004; p. 3663-3665.*

(Continued)

*Primary Examiner* — Mohammad Islam
*Assistant Examiner* — John P Dulka
(74) *Attorney, Agent, or Firm* — Gates & Cooper LLP

(57) ABSTRACT

An (Al, Ga, In)N light emitting device, such as a light emitting diode (LED), in which high light generation efficiency is realized by fabricating the device on non-polar or semi-polar III-Nitride crystal geometries. Because non-polar and semi-polar emitting devices have significantly lower piezoelectric effects than c-plane emitting devices, higher efficiency emitting devices at higher current densities can be realized.

26 Claims, 18 Drawing Sheets

(51) Int. Cl.
*B82Y 20/00* (2011.01)
*H01L 33/06* (2010.01)
*H01L 33/16* (2010.01)
*H01L 33/22* (2010.01)
*H01S 5/22* (2006.01)
*H01S 5/223* (2006.01)
*H01S 5/34* (2006.01)
*H01S 5/343* (2006.01)

(52) U.S. Cl.
CPC ............... *H01L 33/22* (2013.01); *H01S 5/2201* (2013.01); *H01S 5/2231* (2013.01); *H01S 5/3404* (2013.01); *H01S 5/34333* (2013.01)

(56) References Cited

U.S. PATENT DOCUMENTS

| | | | |
|---|---|---|---|
| 6,316,785 B1 | 11/2001 | Nunoue et al. | |
| 6,958,494 B2* | 10/2005 | Lin et al. | 257/86 |
| 7,084,436 B2 | 8/2006 | DenBaars et al. | |
| 7,091,514 B2 | 8/2006 | Craven et al. | |
| 7,186,302 B2 | 3/2007 | Chakraborty et al. | |
| 7,344,958 B2 | 3/2008 | Murai et al. | |
| 7,345,298 B2 | 3/2008 | Weisbuch et al. | |
| 7,361,576 B2 | 4/2008 | Imer et al. | |
| 7,575,947 B2 | 8/2009 | Iza et al. | |
| 7,582,910 B2 | 9/2009 | David et al. | |
| 7,687,293 B2 | 3/2010 | Sato et al. | |
| 7,687,813 B2 | 3/2010 | Nakamura et al. | |
| 7,691,658 B2 | 4/2010 | Kaeding et al. | |
| 7,704,331 B2 | 4/2010 | Baker et al. | |
| 7,704,763 B2 | 4/2010 | Fujii et al. | |
| 7,709,284 B2 | 5/2010 | Iza et al. | |
| 7,719,020 B2 | 5/2010 | Murai et al. | |
| 7,723,216 B2 | 5/2010 | Chakraborty et al. | |
| 2002/0144645 A1 | 10/2002 | Kim et al. | |
| 2002/0195609 A1 | 12/2002 | Yoshitake et al. | |
| 2003/0024475 A1 | 2/2003 | Anderson | |
| 2004/0183088 A1* | 9/2004 | DenBaars et al. | 257/102 |
| 2005/0035354 A1 | 2/2005 | Lin et al. | |
| 2005/0142391 A1 | 6/2005 | Dmitriev et al. | |
| 2005/0161697 A1 | 7/2005 | Nakahata et al. | |
| 2005/0214992 A1 | 9/2005 | Chakraborty et al. | |
| 2005/0224816 A1* | 10/2005 | Kim et al. | 257/79 |
| 2005/0247950 A1 | 11/2005 | Nakamura et al. | |
| 2005/0258451 A1 | 11/2005 | Saxler et al. | |
| 2006/0049411 A1 | 3/2006 | Nakamura et al. | |
| 2006/0126688 A1* | 6/2006 | Kneissl | 372/43.01 |
| 2006/0175624 A1 | 8/2006 | Sharma et al. | |
| 2006/0234486 A1 | 10/2006 | Speck et al. | |
| 2006/0246722 A1 | 11/2006 | Speck et al. | |
| 2006/0278865 A1 | 12/2006 | Craven et al. | |
| 2007/0015345 A1 | 1/2007 | Baker et al. | |
| 2007/0085100 A1 | 4/2007 | Diana et al. | |
| 2007/0093073 A1 | 4/2007 | Farrell, Jr. et al. | |
| 2007/0102721 A1* | 5/2007 | DenBaars et al. | 257/98 |
| 2007/0125995 A1 | 6/2007 | Weisbuch et al. | |
| 2007/0128844 A1 | 6/2007 | Craven et al. | |
| 2007/0145397 A1 | 6/2007 | DenBaars et al. | |
| 2007/0184637 A1 | 8/2007 | Haskell et al. | |
| 2007/0252164 A1 | 11/2007 | Zhong et al. | |
| 2008/0006831 A1* | 1/2008 | Ng | 257/79 |
| 2008/0026502 A1 | 1/2008 | Imer et al. | |
| 2008/0087909 A1 | 4/2008 | Weisbuch et al. | |
| 2008/0121917 A1 | 5/2008 | Weisbuch et al. | |
| 2008/0121918 A1 | 5/2008 | DenBaars et al. | |
| 2008/0128730 A1 | 6/2008 | Fellows et al. | |
| 2008/0128731 A1 | 6/2008 | DenBaars et al. | |
| 2008/0135864 A1 | 6/2008 | David et al. | |
| 2008/0149949 A1 | 6/2008 | Nakamura et al. | |
| 2008/0163814 A1 | 7/2008 | Kim et al. | |
| 2008/0164489 A1 | 7/2008 | Schmidt et al. | |
| 2008/0179607 A1 | 7/2008 | DenBaars et al. | |
| 2008/0182420 A1 | 7/2008 | Hu et al. | |
| 2009/0072353 A1 | 3/2009 | Hirai et al. | |
| 2009/0250686 A1 | 10/2009 | Sato et al. | |
| 2009/0310640 A1 | 12/2009 | Sato et al. | |
| 2010/0108985 A1 | 5/2010 | Chung et al. | |

FOREIGN PATENT DOCUMENTS

| | | |
|---|---|---|
| JP | 2004-335559 | 11/2004 |
| JP | 2006-100684 | 4/2006 |
| JP | 2006-135276 | 5/2006 |
| JP | 2006-156590 | 6/2006 |
| JP | 2006261688 | 9/2006 |
| WO | WO 2005064643 A1 * | 7/2005 |
| WO | WO 2005104236 A2 * | 11/2005 |
| WO | 2006130696 | 12/2006 |

OTHER PUBLICATIONS

Chakraborty et al.,"Demonstration of nonpolar m-plane InGaN/GaN light emitting diodes on free-standing m-plane GaN substrates", Japanese Journal of Applied Physics (JJAP); vol. 44 No. 5 2005, p. 173-175.*

Sharma et al.; Demonstration of a semipolar (1013) InGaN/GaN green light emitting diode; Applied Physics Letters, vol. 87, Nov. 30, 2005, p. 231110-1-231110-3.*

SemiconductorToday-Compounds & Advanced Silicon; http://www.semiconductor-today.com/news_items/DEC_06/UCSB_181206. htm; Juno Publishing and Media Solutions Ltd; Dec. 18, 2006, pp. 1-3.*

LEDs Magazine; http://ledsmagazine.com/news/3/12/16; PennWell Corportation; Dec. 19, 2006, pp. 1-2.*

Chakraborty, Arpan et al., Nonpolar m-plane blue-light-emitting diode lamps with output power of 23.5mW under pulsed operation; Japanese Journal of Applied Physics, vol. 45, No. 2A; published online Feb. 2006; pp. 739-741.*

International Search Report for PCT Application No. PCT/US07/25248 filed Dec. 11, 2007.

Fujii, T. et al., "Increase in the extraction efficiency of GaN-based light-emitting diodes via surface roughening," Appl. Phys. Lett., Feb. 9, 2004, pp. 855-857, vol. 84, No. 6.

Jasinski, J. et al., "Microstructure of GaAs/GaN interfaces produced by direct wafer fusion," Appl. Phys. Lett., Oct. 21, 2002, pp. 3152-3154, vol. 81, No. 17.

Kish, F.A. et al "Very high-efficiency semiconductor wafer-bonded transparent-substrate (AlxGz1-x)0.5In0.5P/GaP light-emitting diodes," Appl. Phys. Lett, May 23, 1994, pp. 2839-2841, vol. 42, No. 21.

Liau, Z.L. et al., "Wafer fusion: A novel technique for optoelectronic device fabrication and monolithic integration," Appl. Phys. Lett., Feb. 19, 1990, pp. 737-739, vol. 56, No. 8.

Murai, A. et al., "Wafer Bonding of GaN and ZnSSe for Optoelectronic Applications," Jpn. J. Appl. Phys., 2004, pp. L1275-L1277, vol. 43, No. 10A.

Nakahara, K. et al., "Improved External Efficiency InGaN-Based Light-Emitting Diodes with Transparent Conductive Ga-Doped Zn0 as p-Electrodes," Jpn. J. Appl. Phys., 2004, pp. L180-L182, vol. 43, No. 2A.

Nakamura, S. et al., "High-Brightness InGaN Blue, Green and Yellow Light-Emitting Diodes with Quantum Well Structures," Jpn. J. Appl. Phys., Jul. 1, 1995, pp. L797-L799.

Narukawa, Y. et al., "Ultra-High Efficiency White Light Emitting Diodes," Jpn. J. Appl. Phys., 2006, pp. L1084-L1086, vol. 45, No. 41.

Shag, Y-P. et al., "Electrical Characterization of Semipolar Gallium Nitride Thin Films," NNIN REU Research Accomplishments, Aug. 2005, pp. 132-133.

Bigenwald et al., "Confined excitons in GaN-AlGaN quantum wells," Phys. Stat Sol. (b) 216, 371 (1999).

Craven, M.D., et al., "Characterization of a-Plane GaN/(Al,Ga)N Multiple Quantum Wells Grown via Metalorganic Chemical Vapor Deposition" Jpn. J. Appl. Phys. vol. 42, (2003), pp. L235-L238.

Craven, M.D., et al., "Threading dislocation reduction via laterally overgrown nonpolar (1120) a-plane GaN" Appl. Phys. Lett. 81 (7), Aug. 12, 2002, pp. 1201-1203.

(56) References Cited

OTHER PUBLICATIONS

Gardner et al., "Polarization anisotropy in the electroluminescence of m-plane InGaN-GaN multiple-quantum-well light-emitting diodes," Applied Physics Letters 86, 111101 (2005).
Grandjean, N., et al., "Built-in electric-field effects in wurtzite AlGaN quantum wells" J. Appl. Phys. 86 (7), Oct. 1, 1999, pp. 3714-3720.
Im, J.S., et. al., "Reduction of oscillator strength due to piezoelectric fields in GaN/$Al_xGa_{1-x}$N quantum wells" Phys. Rev. B. 57 (16), Apr. 15, 1998—II, pp. R9435-R9438.
Kinoshita et al , "Emission enhancement of GaN/AlGaN single-quantum-wells due to screening of piezoelectric field," MRS Internet J. Nitride Semicond. Res. 5, W11.32 (2000).
Kuokstis et al., "Polarization effects in photoluminescence of C- and M-plane GaN/AlGaN multiple quantum wells," Appl. Phys. Lett. 81, 4130 (2002).
Langer, R., et. al., "Giant electric fields in unstrained GaN single quantum wells" Appl. Phys. Lett., 74 (25), Jun. 21, 1999, pp. 3827-3829.
Lefebvre, P. et al., "High internal electric field in a graded-width InGaN/GaN quantum well: Accurate determination by time-resolved photoluminescence spectroscopy" Appl. Phys. Lett. 78 (9), Feb. 26, 2001, pp. 1252-1254.
Lefebvre, P., et al., "Time-resolved photoluminescence as a probe of internal electric fields in GaN-(GaAl)N quantum wells" Phys. Rev. B. 59 (23), Jun. 15, 1999—I, pp. 15363-15367.
Leroux, M., "Barrier-width dependence of group-III nitrides quantum-well transition energies" Phys. Rev. B. 60 (3), Jul. 15, 1999, pp. 1496-1499.
Leroux et al., "Quantum confined Stark effect due to built-in internal polarization fields in (Al,Ga)N/GaN quantum wells," Phys. Rev. B 58, R113371 (1998).
Miller et al., "Electric field dependence of optical absorption near the band gap of quantum-well structures," The American Physical Society, Physical Review B, vol. 32, No. 2 (Jul. 15, 1985), pp. 1043-1066.
Mukai et al., "Ultraviolet InGaN and GaN single-quantum-well-structure light-emitting diodes grown on epitaxially laterally overgrown GaN substrates," Jpn. J. Appl. Phys., vol. 38, pp. 5735-5739 (1999).
Neubert, "Growth characteristics of GaInN quantum wells on semipolar GaN facets," Annual Report 2005, Optoelectronics Department, University of Ulm 2006, pp. 1-6.

Nishizuka, K., "Efficient Radiative Recombination From <1122>-oriented $In_xGa1-x$N Multiple Quantum Wells Fabricated by the Regrowth Technique," Applied Physics Letters, Oct. 2004, vol. 85, No. 15, pp. 3122-3124, abstract.
Ng, H. M., "Molecular-beam epitaxy of GaN/$Al_xGa_{1-x}$N multiple quantum wells on R-plane (1012) sapphire substrates" Appl. Phys. Lett. 80 (23), Jun. 10, 2002, pp. 4369-4371.
Park, S., et. al., "Spontaneous polarization effects in wurtzite GaN/AlGaN quantum wells and comparison with experiment" Appl. Phys. Lett. 76 (15), Apr. 10, 2000, pp. 1981-1983.
Sun et al., "In surface segregation in M-plane (In,Ga)N/GaN multiple quantum well structures," Applied Physics Letters, vol. 83 No. 25 (Dec. 22, 2003).
Sun et al., "Nonpolar $InxGa_{1-x}$N/GaN(1100) multiple quantum wells grown on $\gamma$-LiAlO$_2$(100) by plasma-assisted molecular-beam epitaxy," Physical Review B 67 (2003).
Takeuchi, T., et. al., "Determination of piezoelectric fields in strained GaInN quantum wells using the quantum-confined Stark effect" Appl. Phys. Lett. 73 (12), Sep. 21, 1998, pp. 1691-1693.
Takeuchi, T., et. al., "Quantum-Confined Stark Effect due to Piezoelectric Fields in GaInN Strained Quantum Wells" Jpn. J. Appl. Phys. vol. 36, Apr. 1, 1997, pp. L382-385.
Takeuchi et al., "Theoretical study of orientation dependence of piezoelectric effects in wurtzite strained GaInN/GaN heterostructures and quantum wells," Jpn. J. Appl. Phys. vol. 39, pp. 413-416, Part 1, No. 2A (Feb. 2000).
Traetta et al., "Effects of the spontaneous polarization and piezoelectric fields on the luminescence spectra of GaN/$Al_{0.15}Ga_{0.85}$N quantum wells", Physica E 7, 929-933 (2000).
Japanese Office Action dated Jul. 31, 2012 for JP application No. 2009-541330.
Japanese Office Action (with English Translation) dated May 28, 2013 for Japanese Patent Application No. 2009-541330.
Nishizuka, K., "Efficient radiative recombination from (1122) oriented $In_xGa1-x$N multiple quantum wells fabricated by the regrowth technique", Applied Physics Letters, Oct. 11, 2004, pp. 3122-3124, vol. 85, No. 15.
Taiwanese Office Action (with English translation) dated Nov. 8, 2013 for Taiwanese Patent Application No. 096147297.
Japanese Office Action (with English translation) dated Feb. 25, 2014 for Japanese Patent Application No. 2009-541330.

\* cited by examiner

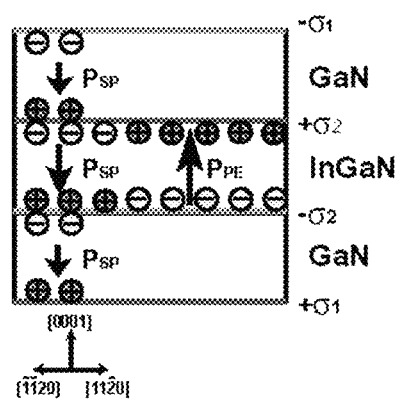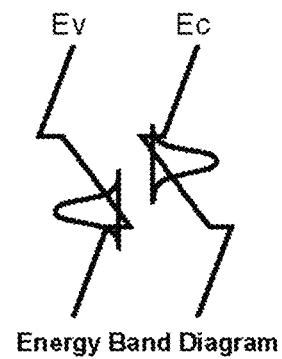
*FIG. 3A*  *FIG. 3B*
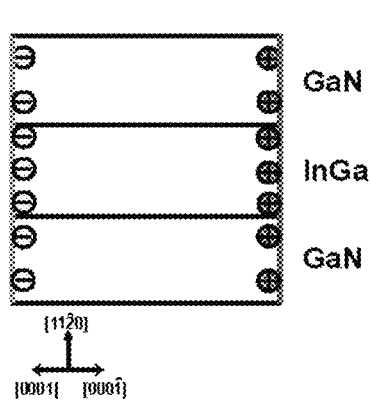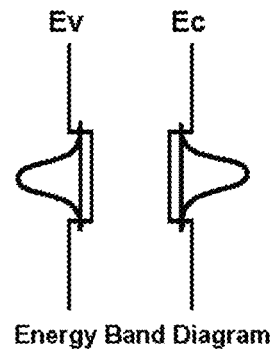
*FIG. 3C*  *FIG. 3D*

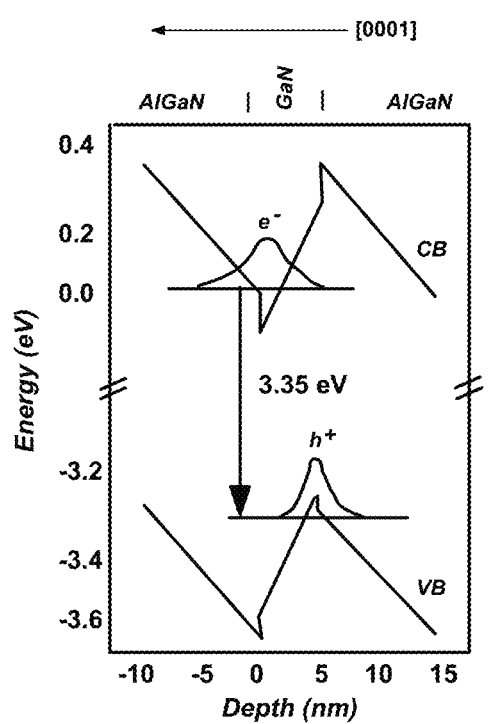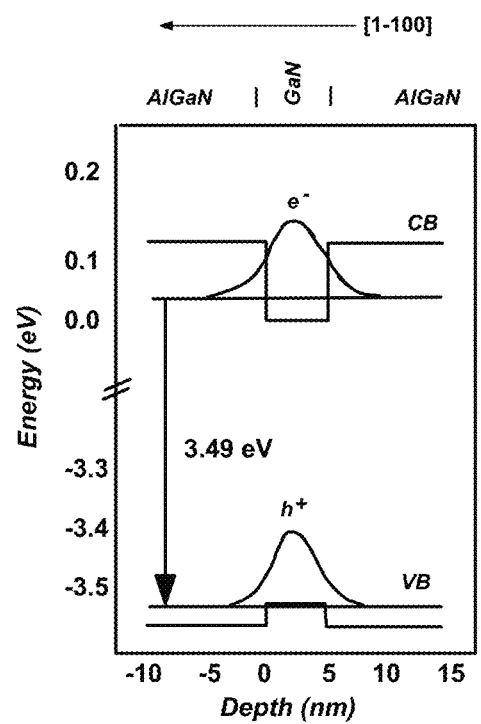
*FIG. 5A*  *FIG. 5B*

NON-POLAR AND SEMI-POLAR LIGHT EMITTING DEVICES

CROSS-REFERENCE TO RELATED APPLICATIONS

This application claims the benefit under 35 U.S.C. Section 119(e) of the following co-pending and commonly-assigned U.S. patent application:

U.S. Provisional Application Ser. No. 60/869,540, filed on Dec. 11, 2006, by Steven P. DenBaars, Mathew C. Schmidt, Kwang Choong Kim, James S. Speck, and Shuji Nakamura, entitled "NON-POLAR (M-PLANE) AND SEMI-POLAR EMITTING DEVICES,";

which application is incorporated by reference herein.

This application is related to the following co-pending and commonly-assigned applications:

U.S. Utility application Ser. No. 10/581,940, filed on Jun. 7, 2006, by Tetsuo Fujii, Yan Gao, Evelyn. L. Hu, and Shuji Nakamura, entitled "HIGHLY EFFICIENT GALLIUM NITRIDE BASED LIGHT EMITTING DIODES VIA SURFACE ROUGHENING," which application claims the benefit under 35 U.S.C. Section 365(c) of PCT Application Serial No. US2003/03921, filed on Dec. 9, 2003, by Tetsuo Fujii, Yan Gao, Evelyn L. Hu, and Shuji Nakamura, entitled "HIGHLY EFFICIENT GALLIUM NITRIDE BASED LIGHT EMITTING DIODES VIA SURFACE ROUGHENING,";

U.S. Utility application Ser. No. 11/054,271, filed on Feb. 9, 2005, by Rajat Sharma, P. Morgan Pattison, John F. Kaeding, and Shuji Nakamura, entitled "SEMICONDUCTOR LIGHT EMITTING DEVICE,";

U.S. Utility application Ser. No. 11/175,761, filed on Jul. 6, 2005, by Akihiko Murai, Lee McCarthy, Umesh K. Mishra and Steven P. DenBaars, entitled "METHOD FOR WAFER BONDING (Al, In, Ga)N and Zn(S, Se) FOR OPTOELECTRONICS APPLICATIONS,", which application claims the benefit under 35 U.S.C. Section 119(e) of U.S. Provisional Application Ser. No. 60/585,673, filed Jul. 6, 2004, by Akihiko Murai, Lee McCarthy, Umesh K. Mishra and Steven P. DenBaars, entitled "METHOD FOR WAFER BONDING (Al, In, Ga)N and Zn(S, Se) FOR OPTOELECTRONICS APPLICATIONS,";

U.S. Utility application Ser. No. 11/697,457, filed Apr. 6, 2007, by, Benjamin A. Haskell, Melvin B. McLaurin, Steven P. DenBaars, James S. Speck, and Shuji Nakamura, entitled "GROWTH OF PLANAR REDUCED DISLOCATION DENSITY M-PLANE GALLIUM NITRIDE BY HYDRIDE VAPOR PHASE EPITAXY,", which application is a continuation of U.S. Utility application Ser. No. 11/140,893, filed May 31, 2005, by, Benjamin A. Haskell, Melvin B. McLaurin, Steven P. DenBaars, James S. Speck, and Shuji Nakamura, entitled "GROWTH OF PLANAR REDUCED DISLOCATION DENSITY M-PLANE GALLIUM NITRIDE BY HYDRIDE VAPOR PHASE EPITAXY,", now U.S. Pat. No. 7,208,393, issued Apr. 24, 2007, which application claims the benefit under 35 U.S.C. Section 119(e) of U.S. Provisional Application Ser. No. 60/576,685, filed Jun. 3, 2004, by Benjamin A. Haskell, Melvin B. McLaurin, Steven P. DenBaars, James S. Speck, and Shuji Nakamura, entitled "GROWTH OF PLANAR REDUCED DISLOCATION DENSITY M-PLANE GALLIUM NITRIDE BY HYDRIDE VAPOR PHASE EPITAXY,";

U.S. Utility application Ser. No. 11/067,957, filed Feb. 28, 2005, by Claude C. A. Weisbuch, Aurelien J. F. David, James S. Speck and Steven P. DenBaars, entitled "HORIZONTAL EMITTING, VERTICAL EMITTING, BEAM SHAPED, DISTRIBUTED FEEDBACK (DFB) LASERS BY GROWTH OVER A PATTERNED SUBSTRATE,";

U.S. Utility application Ser. No. 11/923,414, filed Oct. 24, 2007, by Claude C. A. Weisbuch, Aurelien J. F. David, James S. Speck and Steven P. DenBaars, entitled "SINGLE OR MULTI-COLOR HIGH EFFICIENCY LIGHT EMITTING DIODE (LED) BY GROWTH OVER A PATTERNED SUBSTRATE,", which application is a continuation of U.S. Pat. No. 7,291,864, issued Nov. 6, 2007, to Claude C. A. Weisbuch, Aurelien J. F. David, James S. Speck and Steven P. DenBaars, entitled "SINGLE OR MULTI-COLOR HIGH EFFICIENCY LIGHT EMITTING DIODE (LED) BY GROWTH OVER A PATTERNED SUBSTRATE,";

U.S. Utility application Ser. No. 11/067,956, filed Feb. 28, 2005, by Aurelien J. F. David, Claude C. A Weisbuch and Steven P. DenBaars, entitled "HIGH EFFICIENCY LIGHT EMITTING DIODE (LED) WITH OPTIMIZED PHOTONIC CRYSTAL EXTRACTOR,";

U.S. Utility application Ser. No. 11/621,482, filed Jan. 9, 2007, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE,", which application is a continuation of U.S. Utility application Ser. No. 11/372,914, filed Mar. 10, 2006, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE,", now U.S. Pat. No. 7,220,324, issued May 22, 2007, which application claims the benefit under 35 U.S.C. Section 119(e) of U.S. Provisional Application Ser. No. 60/660,283, filed Mar. 10, 2005, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE,";

U.S. Utility application Ser. No. 11/403,624, filed Apr. 13, 2006, by James S. Speck, Troy J. Baker and Benjamin A. Haskell, entitled "WAFER SEPARATION TECHNIQUE FOR THE FABRICATION OF FREE-STANDING (AL, IN, GA)N WAFERS,", which application claims the benefit under 35 U.S.C. Section 119(e) of U.S. Provisional Application Ser. No. 60/670,810, filed Apr. 13, 2005, by James S. Speck, Troy J. Baker and Benjamin A. Haskell, entitled "WAFER SEPARATION TECHNIQUE FOR THE FABRICATION OF FREE-STANDING (AL, IN, GA)N WAFERS,";

U.S. Utility application Ser. No. 11/403,288, filed Apr. 13, 2006, by James S. Speck, Benjamin A. Haskell, P. Morgan Pattison and Troy J. Baker, entitled "ETCHING TECHNIQUE FOR THE FABRICATION OF THIN (AL, IN, GA)N LAYERS,", which application claims the benefit under 35 U.S.C. Section 119(e) of U.S. Provisional Application Ser. No. 60/670,790, filed Apr. 13, 2005, by James S. Speck, Benjamin A. Haskell, P. Morgan Pattison and Troy J. Baker, entitled "ETCHING TECHNIQUE FOR THE FABRICATION OF THIN (AL, IN, GA)N LAYERS,";

U.S. Utility application Ser. No. 11/454,691, filed on Jun. 16, 2006, by Akihiko Murai, Christina Ye Chen, Daniel B. Thompson, Lee S. McCarthy, Steven P. DenBaars, Shuji Nakamura, and Umesh K. Mishra, entitled "(Al,Ga,In)N AND ZnO DIRECT WAFER BONDING STRUCTURE FOR OPTOELECTRONIC APPLICATIONS AND ITS FABRICATION METHOD,", which application claims the benefit under 35 U.S.C. Section 119(e) of U.S. Provisional Application Ser. No. 60/691,710, filed on Jun. 17, 2005, by Akihiko Murai, Christina Ye Chen, Lee S. McCarthy, Steven P. DenBaars, Shuji Nakamura, and Umesh K. Mishra, entitled "(Al, Ga, In)N AND ZnO DIRECT WAFER BONDING STRUCTURE FOR OPTOELECTRONIC APPLICATIONS, AND ITS FABRICATION METHOD,", U.S. Provisional Application Ser. No. 60/732,319, filed on Nov. 1, 2005, by Akihiko Murai, Christina Ye Chen, Daniel B. Thompson, Lee S. McCarthy, Steven P. DenBaars, Shuji Nakamura, and Umesh K. Mishra, entitled "(Al, Ga, In)N AND ZnO DIRECT WAFER BONDED STRUCTURE FOR OPTOELECTRONIC APPLICATIONS, AND ITS FABRICATION METHOD,", and U.S. Provisional Application Ser. No. 60/764,881, filed on Feb. 3, 2006, by Akihiko Murai, Christina Ye Chen, Daniel B. Thompson, Lee S. McCarthy, Steven P. DenBaars, Shuji Nakamura, and Umesh K. Mishra, entitled "(Al,Ga,In)N AND ZnO DIRECT WAFER BONDED STRUCTURE FOR OPTOELECTRONIC APPLICATIONS AND ITS FABRICATION METHOD,";

U.S. Utility application Ser. No. 11/444,084, filed May 31, 2006, by Bilge M, Imer, James S. Speck, and Steven P. DenBaars, entitled "DEFECT REDUCTION OF NON-POLAR GALLIUM NITRIDE WITH SINGLE-STEP SIDEWALL LATERAL EPITAXIAL OVERGROWTH,", which claims the benefit under 35 U.S.C. 119(e) of U.S. Provisional Application Ser. No. 60/685,952, filed on May 31, 2005, by Bilge M, Imer, James S. Speck, and Steven P. DenBaars, entitled "DEFECT REDUCTION OF NON-POLAR GALLIUM NITRIDE WITH SINGLE-STEP SIDEWALL LATERAL EPITAXIAL OVERGROWTH,";

U.S. Utility application Ser. No. 11/870,115, filed Oct. 10, 2007, by Bilge M, Imer, James S. Speck, Steven P. DenBaars and Shuji Nakamura, entitled "GROWTH OF PLANAR NON-POLAR M-PLANE III-NITRIDE USING METALORGANIC CHEMICAL VAPOR DEPOSITION (MOCVD),", which application is a continuation of U.S. Utility application Ser. No. 11/444,946, filed May 31, 2006, by Bilge M, Imer, James S. Speck, and Steven P. DenBaars, entitled "GROWTH OF PLANAR NON-POLAR {1-100} M-PLANE GALLIUM NITRIDE WITH METALORGANIC CHEMICAL VAPOR DEPOSITION (MOCVD),", which claims the benefit under 35 U.S.C. 119(e) of U.S. Provisional Application Ser. No. 60/685,908, filed on May 31, 2005, by Bilge M, Imer, James S. Speck, and Steven P. DenBaars, entitled "GROWTH OF PLANAR NON-POLAR {1-100} M-PLANE GALLIUM NITRIDE WITH METALORGANIC CHEMICAL VAPOR DEPOSITION (MOCVD),";

U.S. Utility application Ser. No. 11/444,946, filed Jun. 1, 2006, by Robert M. Farrell, Troy J. Baker, Arpan Chakraborty, Benjamin A. Haskell, P. Morgan Pattison, Rajat Sharma, Umesh K. Mishra, Steven P. DenBaars, James S. Speck, and Shuji Nakamura, entitled "TECHNIQUE FOR THE GROWTH AND FABRICATION OF SEMI-POLAR (Ga, Al, In, B)N THIN FILMS, HETEROSTRUCTURES, AND DEVICES,", which claims the benefit under 35 U.S.C. 119(e) of U.S. Provisional Application Ser. No. 60/686,244, filed on Jun. 1, 2005, by Robert M. Farrell, Troy J. Baker, Arpan Chakraborty, Benjamin A. Haskell, P. Morgan Pattison, Rajat Sharma, Umesh K. Mishra, Steven P. DenBaars, James S. Speck, and Shuji Nakamura, entitled "TECHNIQUE FOR THE GROWTH AND FABRICATION OF SEMI-POLAR (Ga, Al, In, B)N THIN FILMS, HETEROSTRUCTURES, AND DEVICES,";

U.S. Utility application Ser. No. 11/251,365 filed Oct. 14, 2005, by Frederic S. Diana, Aurelien J. F. David, Pierre M. Petroff, and Claude C. A. Weisbuch, entitled "PHOTONIC STRUCTURES FOR EFFICIENT LIGHT EXTRACTION AND CONVERSION IN MULTI-COLOR LIGHT EMITTING DEVICES,";

U.S. Utility application Ser. No. 11/633,148, filed Dec. 4, 2006, Claude C. A. Weisbuch and Shuji Nakamura, entitled "IMPROVED HORIZONTAL EMITTING, VERTICAL EMITTING, BEAM SHAPED, DISTRIBUTED FEEDBACK (DFB) LASERS FABRICATED BY GROWTH OVER A PATTERNED SUBSTRATE WITH MULTIPLE OVERGROWTH,", which application claims the benefit under 35 U.S.C. Section 119(e) of U.S. Provisional Application Ser. No. 60/741,935, filed Dec. 2, 2005, Claude C. A. Weisbuch and Shuji Nakamura, entitled "IMPROVED HORIZONTAL EMITTING, VERTICAL EMITTING, BEAM SHAPED, DFB LASERS FABRICATED BY GROWTH OVER PATTERNED SUBSTRATE WITH MULTIPLE OVERGROWTH,";

U.S. Utility application Ser. No. 11/517,797, filed Sep. 8, 2006, by Michael Iza, Troy J. Baker, Benjamin A. Haskell, Steven P. DenBaars, and Shuji Nakamura, entitled "METHOD FOR ENHANCING GROWTH OF SEMI-POLAR (Al, In, Ga, B)N VIA METALORGANIC CHEMICAL VAPOR DEPOSITION,", which claims the benefit under 35 U.S.C. 119(e) of U.S. Provisional Application Ser. No. 60/715,491, filed on Sep. 9, 2005, by Michael Iza, Troy J. Baker, Benjamin A. Haskell, Steven P. DenBaars, and Shuji Nakamura, entitled "METHOD FOR ENHANCING GROWTH OF SEMI-POLAR (Al, In, Ga, B)N VIA METALORGANIC CHEMICAL VAPOR DEPOSITION,";

U.S. Utility application Ser. No. 11/593,268, filed on Nov. 6, 2006, by Steven P. DenBaars, Shuji Nakamura, Hisashi Masui, Natalie N. Fellows, and Akihiko Murai, entitled "HIGH LIGHT EXTRACTION EFFICIENCY LIGHT EMITTING DIODE (LED),", which application claims the benefit under 35 U.S.C. Section 119(e) of U.S. Provisional Application Ser. No. 60/734,040, filed on Nov. 4, 2005, by Steven P. DenBaars, Shuji Nakamura, Hisashi Masui, Natalie N. Fellows, and Akihiko Murai, entitled "HIGH LIGHT EXTRACTION EFFICIENCY LIGHT EMITTING DIODE (LED),";

U.S. Utility application Ser. No. 11/608,439, filed on Dec. 8, 2006, by Steven P. DenBaars, Shuji Nakamura and James S. Speck, entitled "HIGH EFFICIENCY LIGHT EMITTING DIODE (LED),", which application claims the benefit under 35 U.S.C. Section 119(e) of U.S. Provisional Application Ser. No. 60/748,480, filed on Dec. 8, 2005, by Steven P. DenBaars, Shuji Nakamura and James S. Speck, entitled "HIGH EFFICIENCY LIGHT EMITTING DIODE (LED),", and U.S. Provisional Application Ser. No. 60/764,975, filed on Feb. 3, 2006, by Steven P. DenBaars, Shuji Nakamura and James S. Speck, entitled "HIGH EFFICIENCY LIGHT EMITTING DIODE (LED),";

U.S. Utility application Ser. No. 11/676,999, filed on Feb. 20, 2007, by Hong Zhong, John F. Kaeding, Rajat Sharma, James S. Speck, Steven P. DenBaars and Shuji Nakamura, entitled "METHOD FOR GROWTH OF SEMI-POLAR (Al, In,Ga,B)N OPTOELECTRONIC DEVICES,", which application claims the benefit under 35 U.S.C. Section 119(e) of U.S. Provisional Application Ser. No. 60/774,467, filed on Feb. 17, 2006, by Hong Zhong, John F. Kaeding, Rajat Sharma, James S. Speck, Steven P. DenBaars and Shuji Nakamura, entitled "METHOD FOR GROWTH OF SEMI-POLAR (Al,In,Ga,B)N OPTOELECTRONIC DEVICES,";

U.S. Utility patent application Ser. No. 11/840,057, filed on Aug. 16, 2007, by Michael Iza, Hitoshi Sato, Steven P. DenBaars, and Shuji Nakamura, entitled "METHOD FOR DEPOSITION OF MAGNESIUM DOPED (Al, In, Ga, B)N LAYERS,", which claims the benefit under 35 U.S.C. 119(e) of U.S. Provisional Patent Application Ser. No. 60/822,600, filed on Aug. 16, 2006, by Michael Iza, Hitoshi Sato, Steven P. DenBaars, and Shuji Nakamura, entitled "METHOD FOR DEPOSITION OF MAGNESIUM DOPED (Al, In, Ga, B)N LAYERS,";

U.S. Utility patent application Ser. No. 11/940,848, filed on Nov. 15, 2007, by Aurelien J. F. David, Claude C. A. Weisbuch and Steven P. DenBaars entitled "HIGH LIGHT EXTRACTION EFFICIENCY LIGHT EMITTING DIODE (LED) THROUGH MULTIPLE EXTRACTORS,", which application claims the benefit under 35 U.S.C. Section 119(e) of U.S. Provisional Patent Application Ser. No. 60/866,014, filed on Nov. 15, 2006, by Aurelien J. F. David, Claude C. A. Weisbuch and Steven P. DenBaars entitled "HIGH LIGHT EXTRACTION EFFICIENCY LIGHT EMITTING DIODE (LED) THROUGH MULTIPLE EXTRACTORS,", and U.S. Provisional Patent Application Ser. No. 60/883,977, filed on Jan. 8, 2007, by Aurelien J. F. David, Claude C. A. Weisbuch and Steven P. DenBaars entitled "HIGH LIGHT EXTRACTION EFFICIENCY LIGHT EMITTING DIODE (LED) THROUGH MULTIPLE EXTRACTORS,";

U.S. Utility patent application Ser. No. 11/940,853, filed on Nov. 15, 2007, by Claude C. A. Weisbuch, James S. Speck and Steven P. DenBaars entitled "HIGH EFFICIENCY WHITE, SINGLE OR MULTI-COLOUR LIGHT EMITTING DIODES (LEDS) BY INDEX MATCHING STRUCTURES,", which application claims the benefit under 35 U.S.C. Section 119(e) of U.S. Provisional Patent Application Ser. No. 60/866,026, filed on Nov. 15, 2006, by Claude C. A. Weisbuch, James S. Speck and Steven P. DenBaars entitled "HIGH EFFICIENCY WHITE, SINGLE OR MULTI-COLOUR LED BY INDEX MATCHING STRUCTURES,";

U.S. Utility patent application Ser. No. 11/940,866, filed on Nov. 15, 2007, by Aurelien J. F. David, Claude C. A. Weisbuch, Steven P. DenBaars and Stacia Keller, entitled "HIGH LIGHT EXTRACTION EFFICIENCY LIGHT EMITTING DIODE (LED) WITH EMITTERS WITHIN STRUCTURED MATERIALS,", which application claims the benefit under 35 U.S.C. Section 119(e) of U.S. Provisional Patent Application Ser. No. 60/866,015, filed on Nov. 15, 2006, by Aurelien J. F. David, Claude C. A. Weisbuch, Steven P. DenBaars and Stacia Keller, entitled "HIGH LIGHT EXTRACTION EFFICIENCY LED WITH EMITTERS WITHIN STRUCTURED MATERIALS,";

U.S. Utility patent application Ser. No. 11/940,876, filed on Nov. 15, 2007, by Evelyn L. Hu, Shuji Nakamura, Yong Seok Choi, Rajat Sharma and Chiou-Fu Wang, entitled "ION BEAM TREATMENT FOR THE STRUCTURAL INTEGRITY OF AIR-GAP III-NITRIDE DEVICES PRODUCED BY PHOTOELECTROCHEMICAL (PEC) ETCHING,", which application claims the benefit under 35 U.S.C. Section 119(e) of U.S. Provisional Patent Application Ser. No. 60/866,027, filed on Nov. 15, 2006, by Evelyn L. Hu, Shuji Nakamura, Yong Seok Choi, Rajat Sharma and Chiou-Fu Wang, entitled "ION BEAM TREATMENT FOR THE STRUCTURAL INTEGRITY OF AIR-GAP III-NITRIDE DEVICES PRODUCED BY PHOTOELECTROCHEMICAL (PEC) ETCHING,";

U.S. Utility patent application Ser. No. 11/940,885, filed on Nov. 15, 2007, by Natalie N. Fellows, Steven P. DenBaars and Shuji Nakamura, entitled "TEXTURED PHOSPHOR CONVERSION LAYER LIGHT EMITTING DIODE,", which application claims the benefit under 35 U.S.C. Section 119(e) of U.S. Provisional Patent Application Ser. No. 60/866,024, filed on Nov. 15, 2006, by Natalie N. Fellows, Steven P. DenBaars and Shuji Nakamura, entitled "TEXTURED PHOSPHOR CONVERSION LAYER LIGHT EMITTING DIODE,";

U.S. Utility patent application Ser. No. 11/940,872, filed on Nov. 15, 2007, by Steven P. DenBaars, Shuji Nakamura and Hisashi Masui, entitled "HIGH LIGHT EXTRACTION EFFICIENCY SPHERE LED,", which application claims the benefit under 35 U.S.C. Section 119(e) of U.S. Provisional Patent Application Ser. No. 60/866,025, filed on Nov. 15, 2006, by Steven P. DenBaars, Shuji Nakamura and Hisashi Masui, entitled "HIGH LIGHT EXTRACTION EFFICIENCY SPHERE LED,";

U.S. Utility patent application Ser. No. 11/940,883, filed on Nov. 15, 2007, by Shuji Nakamura and Steven P. DenBaars, entitled "STANDING TRANSPARENT MIRRORLESS LIGHT EMITTING DIODE,", which application claims the benefit under 35 U.S.C. Section 119(e) of U.S. Provisional Patent Application Ser. No. 60/866,017, filed on Nov. 15, 2006, by Shuji Nakamura and Steven P. DenBaars, entitled "STANDING TRANSPARENT MIRROR-LESS (STML) LIGHT EMITTING DIODE,"; and U.S. Utility patent application Ser. No. 11/940,898, filed on Nov. 15, 2007, by Steven P. DenBaars, Shuji Nakamura and James S. Speck, entitled "TRANSPARENT MIRRORLESS LIGHT EMITTING DIODE,", which application claims the benefit under 35 U.S.C. Section 119(e) of U.S. Provisional Patent Application Ser. No. 60/866,023, filed on Nov. 15, 2006, by Steven P. DenBaars, Shuji Nakamura and James S. Speck, entitled "TRANSPARENT MIRROR-LESS (TML) LIGHT EMITTING DIODE,";

U.S. Utility patent application Ser. No. 11/954,163, filed on Dec. 11, 2007, by Steven P. DenBaars and Shuji Nakamura, entitled "LEAD FRAME FOR TRANSPARENT MIRRORLESS LIGHT EMITTING DIODE,", which claims the benefit under 35 U.S.C. 119(e) of U.S. Provisional Patent Application Ser. No. 60/869,454, filed on Dec. 11, 2006, by Steven P. DenBaars and Shuji Nakamura, entitled "LEAD FRAME FOR TM-LED,";

U.S. Utility patent application Ser. No. 11/954,154, filed on Dec. 11, 2007, by Shuji Nakamura, Steven P. DenBaars, and Hirokuni Asamizu, entitled, "TRANSPARENT LIGHT EMITTING DIODES,", which claims the benefit under 35 U.S.C. 119(e) of U.S. Provisional Patent Application Ser. No. 60/869,447, filed on Dec. 11, 2006, by Shuji Nakamura, Steven P. DenBaars, and Hirokuni Asamizu, entitled, "TRANSPARENT LEDS,";

U.S. Utility patent application Ser. No. 12/001,286, filed on Dec. 11, 2007, by Mathew C. Schmidt, Kwang Choong Kim, Hitoshi Sato, Steven P. DenBaars, James S. Speck, and Shuji Nakamura, entitled "METALORGANIC CHEMICAL VAPOR DEPOSITION (MOCVD) GROWTH OF HIGH PERFORMANCE NON-POLAR III-NITRIDE OPTICAL DEVICES,", which claims the benefit under 35 U.S.C. 119(e) of U.S. Provisional Patent Application Ser. No. 60/869,535, filed on Dec. 11, 2006, by Mathew C. Schmidt, Kwang Choong Kim, Hitoshi Sato, Steven P. DenBaars, James S. Speck, and Shuji Nakamura, entitled "MOCVD GROWTH OF HIGH PERFORMANCE M-PLANE GAN OPTICAL DEVICES,";

U.S. Utility patent application Ser. No. 11/954,172, filed on Dec. 11, 2007, by Kwang Choong Kim, Mathew C. Schmidt, Feng Wu, Asako Hirai, Melvin B. McLaurin, Steven P. DenBaars, Shuji Nakamura, and James S. Speck, entitled, "CRYSTAL GROWTH OF M-PLANE AND SEMI-POLAR PLANES OF (AL, IN, GA, B)N ON VARIOUS SUBSTRATES,", which claims the benefit under 35 U.S.C. 119(e) of U.S. Provisional Patent Application Ser. No. 60/869,701, filed on Dec. 12, 2006, by Kwang Choong Kim, Mathew C. Schmidt, Feng Wu, Asako Hirai, Melvin B. McLaurin, Steven P. DenBaars, Shuji Nakamura, and James S. Speck, entitled, "CRYSTAL GROWTH OF M-PLANE AND SEMI-POLAR PLANES OF (AL, IN, GA, B)N ON VARIOUS SUBSTRATES,";

all of which applications are incorporated by reference herein.

BACKGROUND OF THE INVENTION

1. Field of the Invention

The present invention is related to high efficiency non-polar and semi-polar light emitting devices such as light emitting diodes (LEDs) and laser diodes (LDs).

2. Description of the Related Art (Note: This application references a number of different publications as indicated throughout the specification. In addition, a list of a number of different publications can be found below in the section entitled "References." Each of these publications is incorporated by reference herein.)

Currently, most commercial gallium nitride (GaN) based light emitting devices are constructed on c-axis oriented crystals. As a result, strong piezo-electric fields control light emission efficiency. In the structure of conventional LEDs and LDs, the thickness of the quantum well (QW) is only around 2-5 nm. When the thickness of the QW layer becomes larger than 5 nm, the conduction energy band and valence energy band of the QW layer is bent due to a strong piezoelectric field, and then the radiative recombination efficiency becomes small, and then the emitting efficiency of the LED and LD becomes smaller.

However, in the case of non-polar or semi-polar GaN, the piezoelectric polarization is minimized. So, the energy band bending in the QW is small. It is expected that the thickness of the QW can be increased to improve the emitting efficiency of the LED and LD. Recently, the inventors of the present invention found that the thickness of the QW should be increased up to 10 nm in the case of non-polar and semi-polar LED and LD to increase the emitting efficiency.

In the case of conventional LEDs, in order to increase the light output power from the front side of the LED, the emitted light is reflected by a mirror placed on the backside of the substrate or is reflected by a mirror coating on the lead frame, even if there are no mirrors on the backside of the sapphire substrate, and if the bonding material is transparent on the emission wavelength. However, this reflected light is re-absorbed by the emitting layer (active layer), because the photon energy is almost same as the band-gap energy of the light emitting species, such as AlInGaN multiple quantum wells (MQWs). The efficiency or output power of the LEDs is decreased due to this re-absorption of the LED light by the emitting layer. See, for example, FIGS. 1, 2 and 3, which are described in more detail below. See also J. J. Appl. Phys. 34, L797-99 (1995) and J. J. Appl. Phys. 43, L180-82 (2004).

What is needed in the art are LED and LD structures that generate light more efficiently in the blue, green, amber, and red regions and that more effectively extract light. The present invention satisfies that need.

SUMMARY OF THE INVENTION

The present invention describes an (Al, Ga, In)N light emitting device in which high light generation efficiency is realized by fabricating the device of novel non-polar or semi-polar GaN crystal geometries. Because non-polar and semi-polar devices have significantly lower piezoelectric effects than polar devices, higher efficiency LEDs and LDs can be realized.

The devices of the present invention can have greater QW thickness, namely greater than 4 nm, preferably from approximately 8-12 μm, and more preferably approximately 10 nm. Through the use of thicker quantum wells in non-polar and semi-polar LEDs, higher efficiencies at higher current densities are achieved. For LDs, the thicker QWs result in increased modal gain, and decreased threshold current density. In another instance, a larger number of QWs can be used to increase efficiency without suffering from higher voltages.

By fabricating the non-polar and semi-polar LEDs with a transparent contact layer, nearly ideal light extraction is realized, even at high current density.

An additional benefit is the fact that the non-polar and semi-polar LEDs generate polarized light much more effectively than c-plane devices. Polarized light emission ratios as high as 0.83 have been observed, making them useful for numerous applications, such as LCD back-lighting, signs, protection displays, and illumination.

The present invention also minimizes internal reflections within the LED by eliminating mirrors and/or mirrored surfaces, in order to minimize re-absorption of light by the emitting or active layer of the LED. To assist in minimizing internal reflections, transparent electrodes, such as ITO or ZnO, may be used.

Surface roughening, texturing, patterning or shaping, for example, by means of anisotropically etching (i.e., creating a cone shaped surface) or otherwise, may also assist in light extraction, as well as minimizing internal reflections. Die shaping also realizes higher light extraction efficiencies.

BRIEF DESCRIPTION OF THE DRAWINGS

Referring now to the drawings in which like reference numbers represent corresponding parts throughout:

FIGS. 3A, 3B, 3C and 3D illustrate the motivation behind using non-polar of gallium nitride planes for device structures and growth.

FIGS. 5A, 5B and 5C illustrate the External Quantum Efficiency (EQE) versus Peak Wavelength (nm) for various polar and non-polar gallium nitride devices, wherein Semi-polar refers to data for a semi-polar LED, C-plane $In_xGa_{1-x}N$ refers to data for a c-plane LED with an $In_xGa_{1-x}N$ active region, Non-polar UCSB refers to data for non-polar LEDs fabricated at the University of California, Santa Barbara (UCSB), UCSB 2006 refers to data for a c-plane LED fabricated at UCSB, IWN by Nichia refers to data for an LED by Nichia at the International Workshop on Nitride Semiconductor (IWN) 2006, $(Al_xGa_{1-x})_{0.52}In_{0.48}P$ refers to data for an $(Al_xGa_{1-x})_{0.52}In_{0.48}P$ based LED, and the wavelength response of the human eye (eye sensitivity profile), and ultraviolet (UV) portion of the spectrum are also shown.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

GaN and its alloys are most stable in the hexagonal würtzite crystal structure, in which the structure is described by two (or three) equivalent basal plane axes that are rotated 120° with respect to each other (the a-axes), all of which are perpendicular to a unique c-axis.

Figure 1:
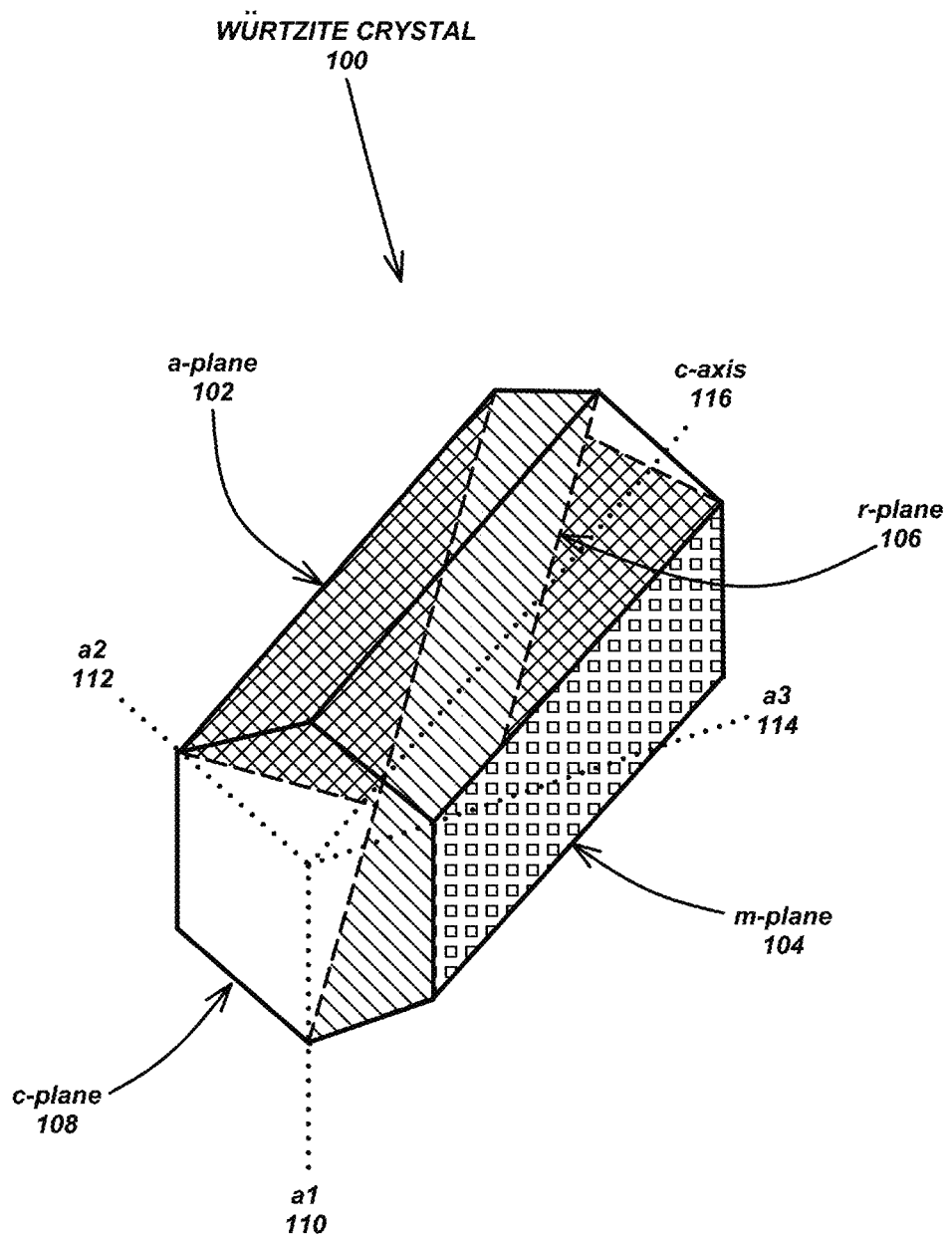
FIG. 1 is a schematic of a hexagonal würtzite crystal structure of gallium nitride.

FIG. 1 is a schematic of a hexagonal würtzite crystal structure 100 of GaN that illustrates the major planes of interest, namely the a-plane {11-20} 102, m-plane {1-100} 104, r-plane {10-12} 106, c-plane [0001] 108, with these axes a1 [1000] 110, a2 [0100] 112, and a3 [0010] 114, along with the c-axis 116, identified therein, wherein the fill patterns are intended to illustrate the planes of interest 102, 104 and 106, but do not represent the materials of the structure 100.

Figure 2:
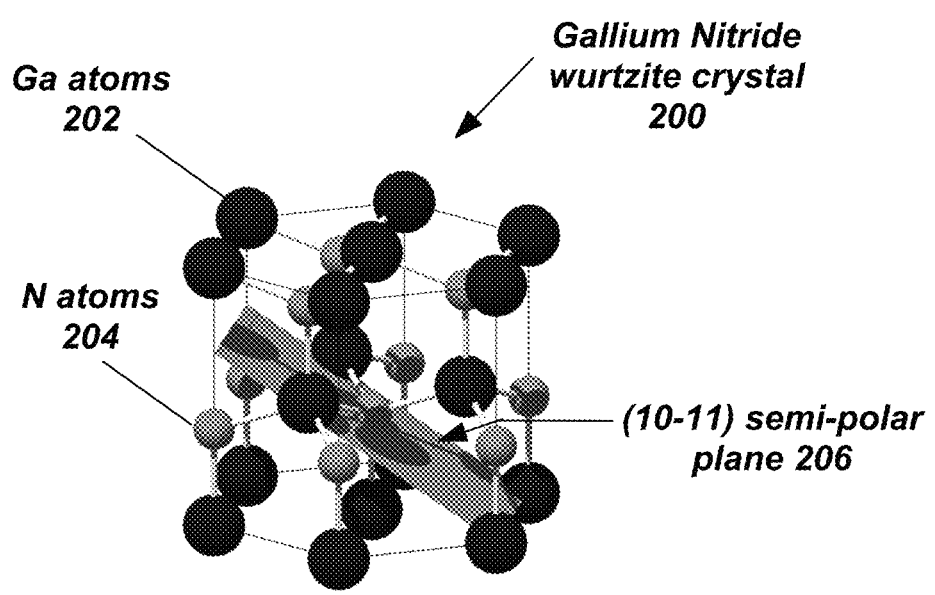
FIG. 2 is another schematic of the crystalline structure of gallium nitride.

FIG. 2 is another schematic of the crystalline structure 200 of GaN, illustrating the placement of Ga atoms 202 and N atoms 204, and showing a semi-polar plane (10-11) 206, which is shown as the shaded plane in the crystalline structure. The group III atoms 202 and nitrogen atoms 204 occupy alternating c-planes along the c-axis of the crystal 200. The symmetry elements included in the würtzite structure 200 dictate that III-nitrides possess a bulk spontaneous polarization along this c-axis. Furthermore, as the würtzite crystal structure 200 is non-centro-symmetric, würtzite nitrides can and do additionally exhibit piezoelectric polarization, also along the c-axis.

Current nitride technology for electronic and optoelectronic devices employs nitride films grown along the polar c-direction. However, conventional c-plane quantum well structures in III-nitride based optoelectronic and electronic devices suffer from the undesirable quantum-confined Stark effect (QCSE), due to the existence of strong piezoelectric and spontaneous polarizations. The strong built-in electric fields along the c-direction cause spatial separation of electrons and holes that in turn give rise to restricted carrier recombination efficiency, reduced oscillator strength, and red-shifted emission.

FIGS. 3A, 3B, 3C and 3D illustrate the motivation behind using non-polar GaN planes for device structures and growth.

FIG. 3A illustrates the spontaneous polarization ($P_{SP}$) and piezoelectric polarization ($P_{PE}$) effects in c-plane (Ga face) structures, wherein $\oplus$ indicates a positive charge, $\ominus$ indicates a negative charge, the arrows represent the direction of polarization, and $-\sigma_1$, $+\sigma_2$, $-\sigma_2$, and $-\sigma_1$ represent energy band inflection points for the GaN (p-type and n-type) and InGaN (active) layers. FIG. 3B illustrates the energy band diagram corresponding to FIG. 3A for the valence band (Ev) and conduction band (Ec).

FIG. 3C illustrates the lack of spontaneous polarization ($P_{SP}$) and piezoelectric polarization ($P_{PE}$) effects in non-polar (a-plane) structures. FIG. 3D illustrates the energy band diagram corresponding to FIG. 3C for the valence band (Ev) and conduction band (Ec).

When using certain planes of the GaN structure, polarization and piezoelectric polarization cause band bending and charge separation, which leads to a light emission red shift, a low recombination efficiency, and a high threshold current, all of which create problems in finished devices. This is especially apparent in the c-plane (Ga face) where the Ev and Ec bands are shown as very disjointed.

Figure 4:
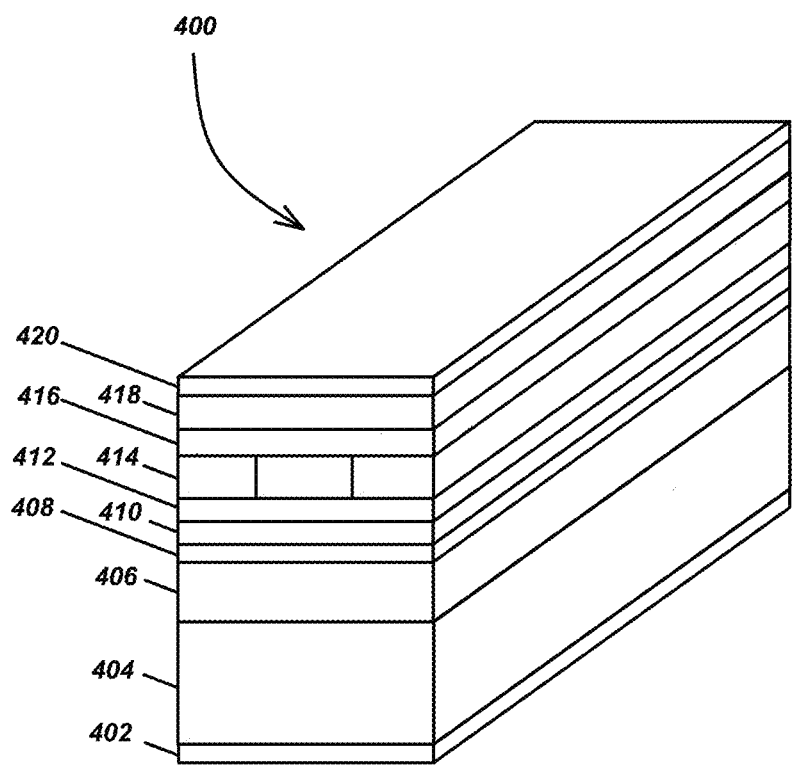
FIG. 4 is a schematic of a device structure according to the present invention.

FIG. 4 is a schematic of a device structure according to the present invention, that further illustrates the motivation behind using non-polar III-nitride layers, which may comprise m-plane or a-plane III-nitride layers. In this figure, a non-polar III-nitride light emitting device comprises a laser diode (LD) structure 400, which includes a Ti—Al contact layer 402, a-plane n-GaN layer 404, n-AlGaN cladding layer 406, n-GaN guiding layer 408, GaN active layer 410, p-GaN guiding layer 412, GaN active layer 414, p-AlGaN cladding layer 416, p-GaN layer 418 and Ni—Au contact layer 420. When a-plane and m-plane growth is achieved, lower dislocation densities are achieved. Further, no polarization field-induced charge separation in the quantum wells occurs, and there is higher mobility in the layers. This results in a lower threshold current, and higher reliability for the finished devices.

Figure 5C:
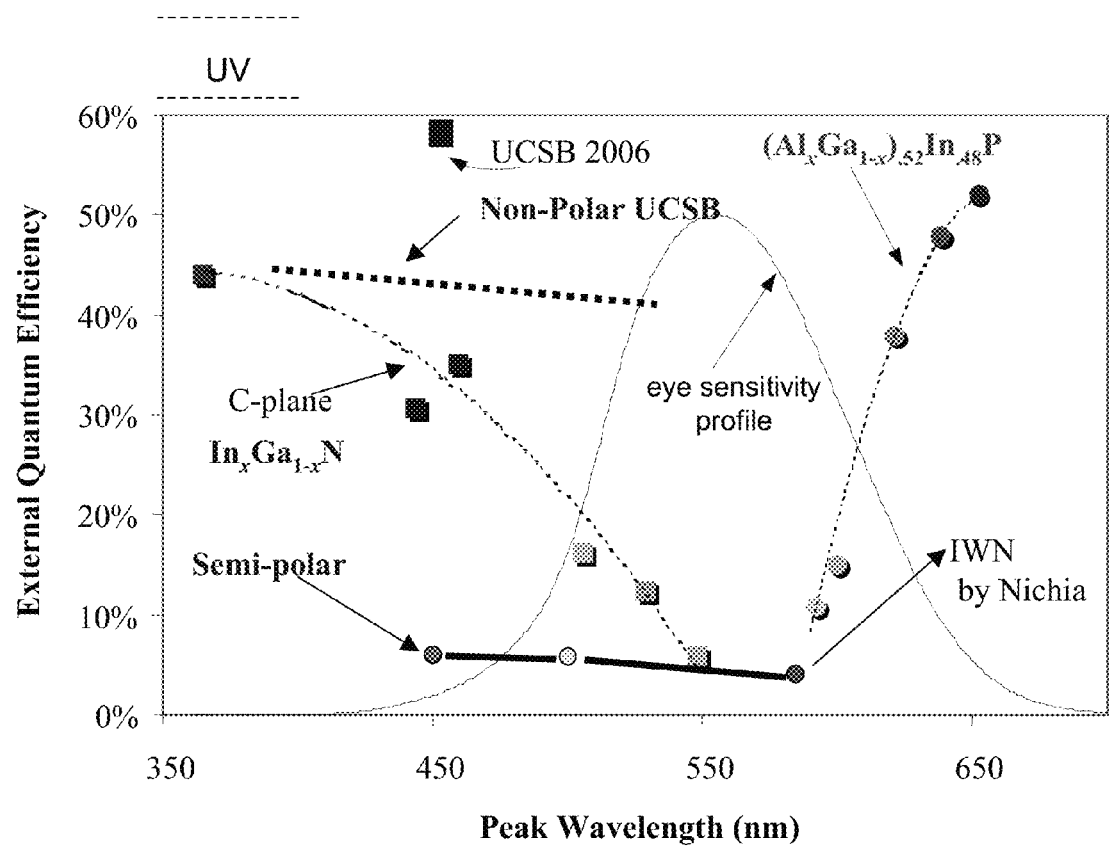

FIGS. 5A, 5B and 5C illustrate the External Quantum Efficiency (EQE) versus Peak Wavelength (nm) for various polar and non-polar GaN devices. The polarization fields in the quantum well region discussed above creates a "gap" in emission in the green region of the visible spectrum, as well as in the ultraviolet region. By using non-polar (m-plane or a-plane) devices, rather than polar c-plane devices, or by using semi-polar device structures, the polarization fields in the quantum well region are reduced or eliminated, which can solve the emission gap problem.

Figure 6:
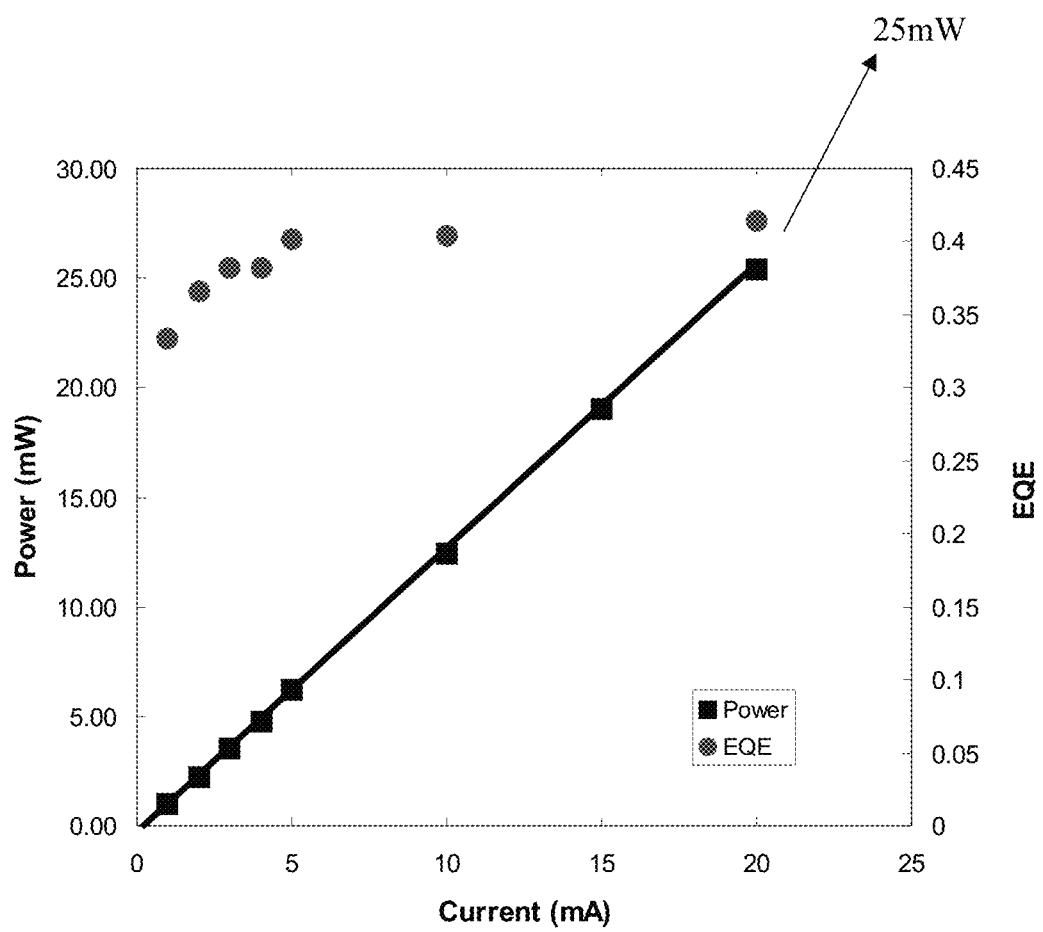
FIG. 6 illustrates the Power Output and External Quantum Efficiency (EQE) vs. Current (mA) for a device manufactured in accordance with the present invention.

FIG. 6 illustrates the Power Output and External Quantum Efficiency (EQE) vs. Current (mA) for a device manufactured in accordance with the present invention. The EQE is a figure of merit for these devices. Further, a 25 milliwatt (mW) device is shown at a 20 milliamp (mA) current input. This result far exceeds any results seen by any non-polar LED device to date.

Figure 7:
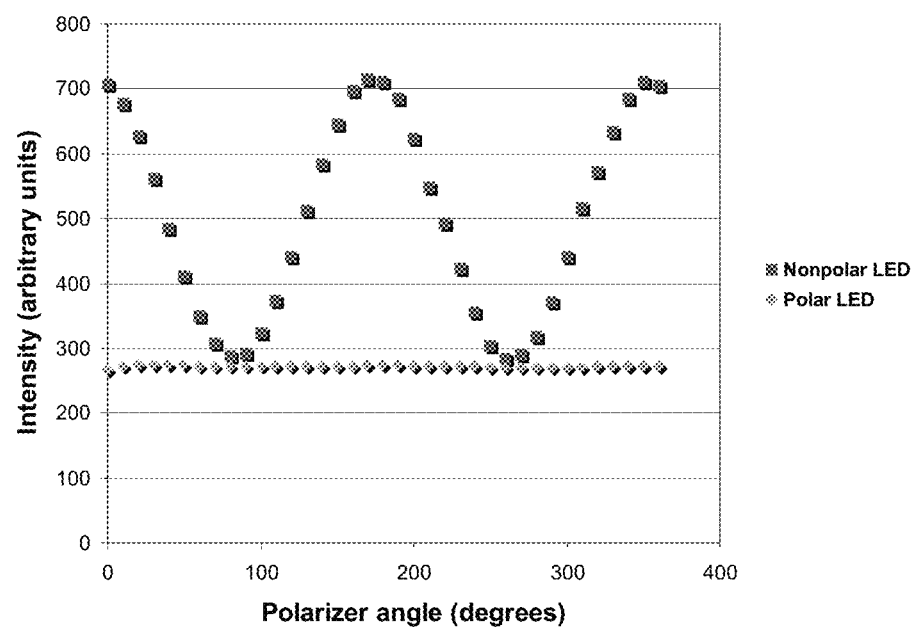
FIG. 7 illustrates the Intensity (arbitrary units) vs. Polarizer Angle (degrees) for polarized light of non-polar (or semi-polar) and polar light emitting diodes.

FIG. 7 illustrates the Intensity (arbitrary units) vs. Polarizer Angle (degrees) for polarized light of non-polar (or semi-polar) and polar LEDs. Further, non-polar and semi-polar LEDs made in accordance with the present invention directly emit polarized light. This is useful for many applications, such as Liquid Crystal Display (LCD) back-lighting, which requires polarized light. With the devices of the present invention, a polarizing filter is not required between the light source and the LCD display, because the light being emitted is already polarized.

Figure 8:
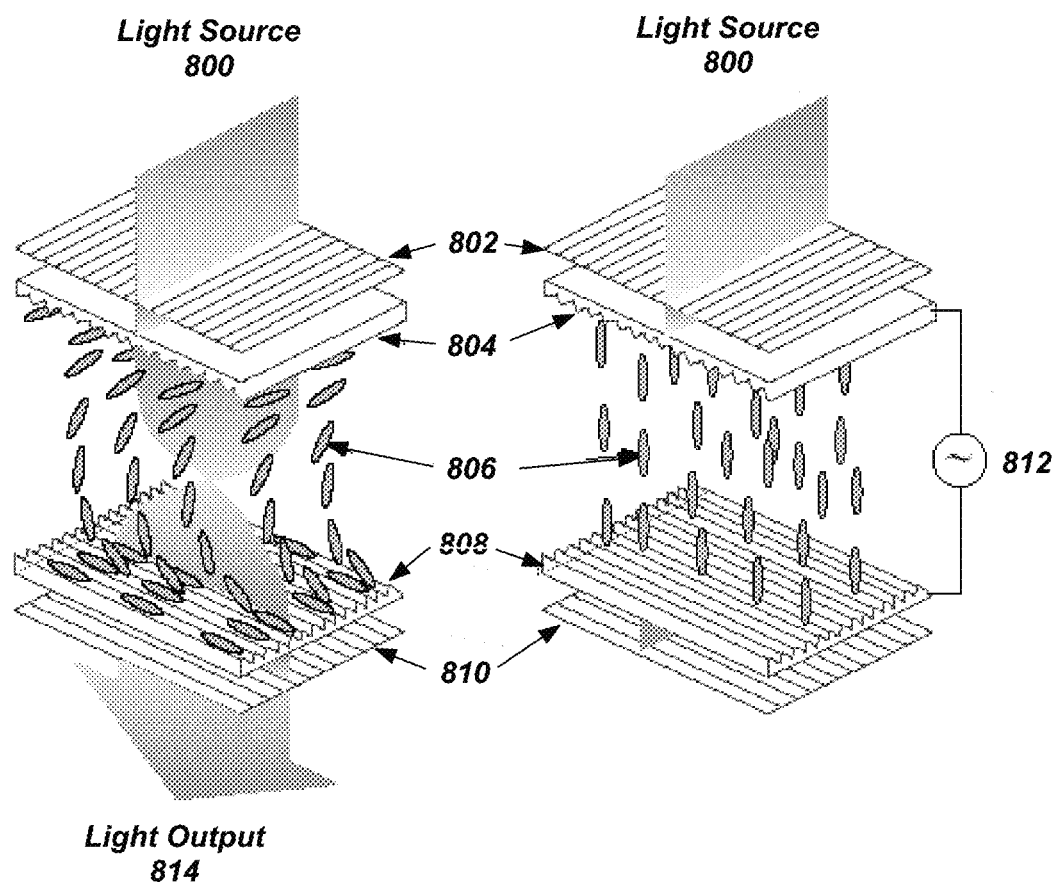
FIG. 8 illustrates additional device structures and additional advantages associated with the present invention.

FIG. 8 illustrates additional device structures and additional advantages associated with the present invention. For example, the non-polar or semi-polar devices manufactured according to the present invention can be used for LCD backlighting, because these devices reduce or eliminate built-in polarization fields. A structure for LCD back-lighting includes a light source 800, polarizer 802, alignment film 804, liquid crystals 806, alignment film 808, polarizer 810, which when activated by an AC voltage source 812 results in light output 814. Moreover, the devices provide a p-type concentration of approximately $7 \times 10^{18}$ cm$^{-3}$ with minimal LED peak wavelength shift vs. current. In addition, as discussed with respect to FIG. 7, since the non-polar (e.g., m-plane or a-plane) or semi-polar LEDs directly emit polarized light, more light 814 is available for the LCD displays. Typically, an additional percentage of light 814 is available, and such percentage has been observed to be approximately 40-70% additional light is available. However, a larger or smaller percentage of light may be available without departing from the scope of the present invention.

Figure 9A:
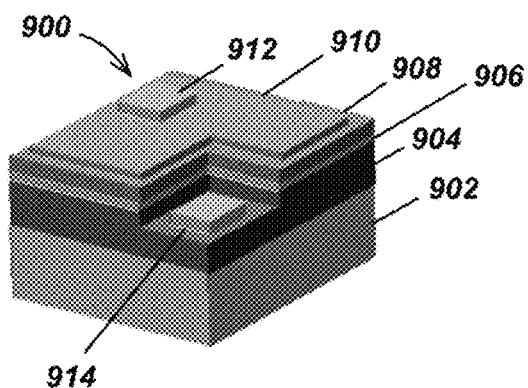
FIGS. 9A and 9B illustrate the structure of c-plane light emitting diodes, which are typically grown along the c-axis.
Figure 9B:
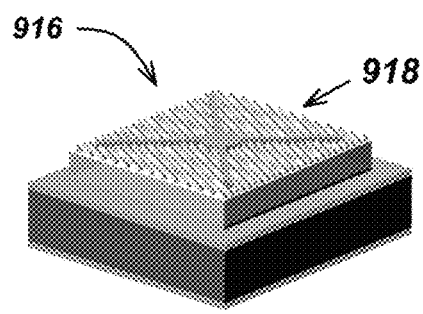

FIGS. 9A and 9B illustrate the structure of c-plane LEDs, which are typically grown along the c-axis. In FIG. 9A, the c-plane LED 900 includes a substrate 902, p-type layer 904, active layer 906, n-type layer 908, electrode 910, bonding pad 912 and electrode 914. FIG. 9B shows a similar c-plane LED 916, wherein the emitting surface is typically on the nitrogen face (N face), which can be roughened 918 or otherwise treated to increase light production from such devices.

Figure 10:
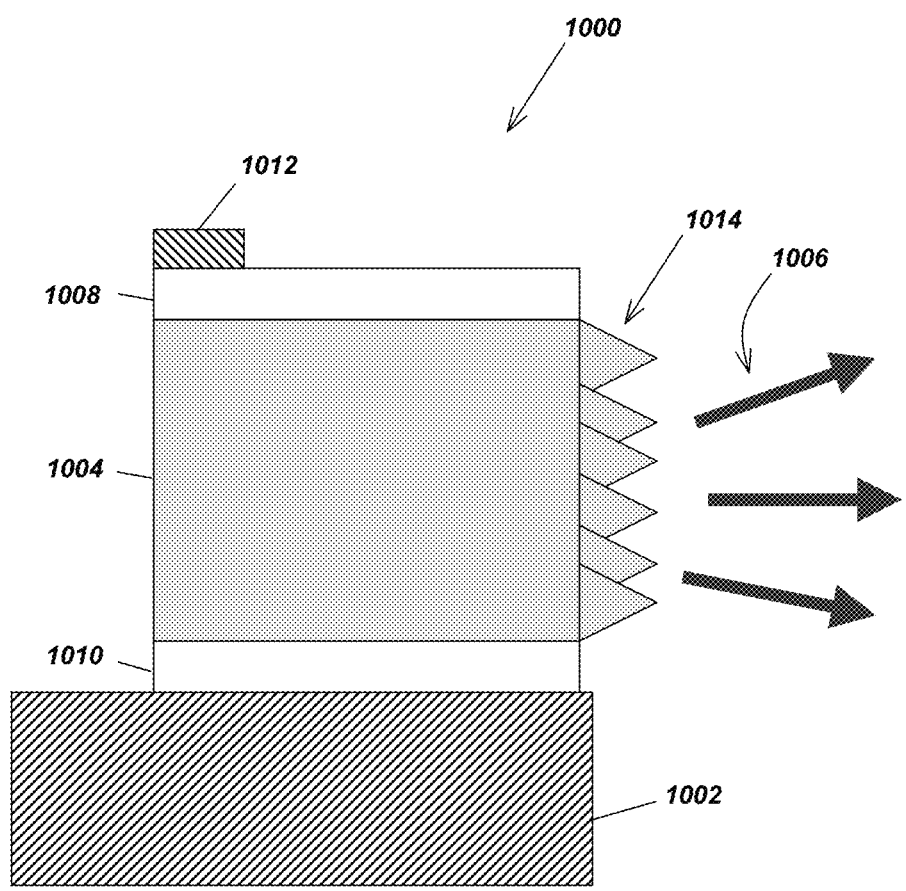
FIG. 10 is a schematic illustrating a side-emitting m-plane light emitting diode in accordance with the present invention.

FIG. 10 is a schematic illustrating a non-polar III-nitride light emitting device having a plurality of non-polar III-nitride layers comprising one or more p-type layers, an active region, and one or more n-type layers in accordance with the present invention. In this embodiment, the device is a side-emitting m-plane LED 1000, which includes a metal lead frame 1002, an ensemble 1004 of p-GaN/GaN/n-GaN layers that emit light 1006, transparent electrode layers 1008, 1010 and p-contact 1012. One or more emitting surfaces of the device 1000 may be a roughened, textured, patterned or shaped surface 1014 to enhance the extraction of light (e.g., the emitting surface of the device 1000 may be a cone shaped surface). Further, the device 1000 comprises a side-emitting device, with appropriate placement of the contact 1012 and metal frame 1002 shown.

Figure 11:
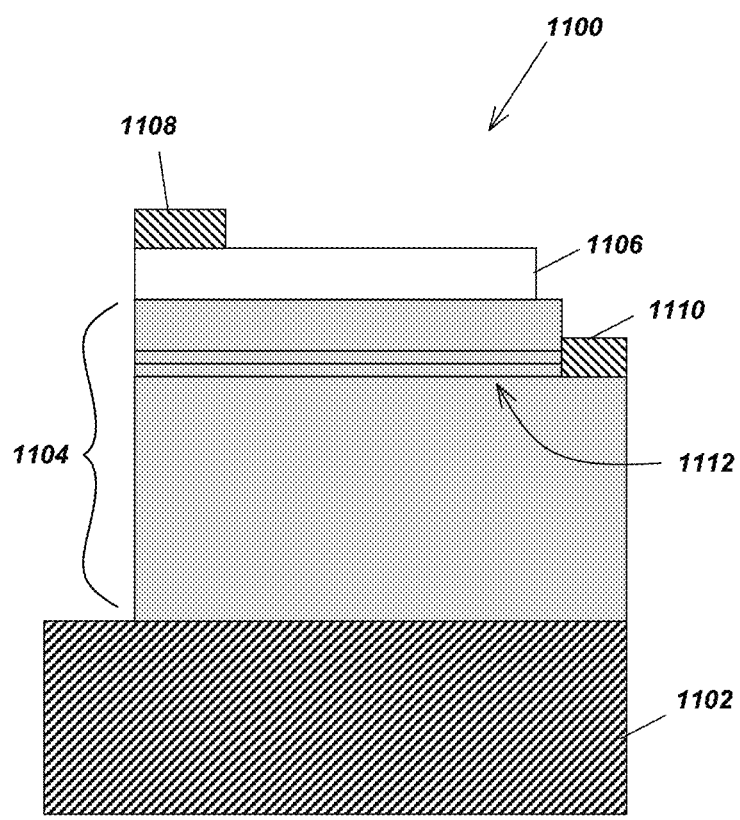
FIG. 11 is a schematic illustrates a vertical top-emitting m-plane light emitting diode in accordance with the present invention.

FIG. 11 is a schematic illustrating another non-polar III-nitride light emitting device having a plurality of non-polar III-nitride layers comprising one or more p-type layers, an active region, and one or more n-type layers in accordance with the present invention. In this embodiment, the device is a vertical top-emitting m-plane LED 1100, which includes a substrate 1102, an ensemble 1104 of p-GaN/GaN/n-GaN layers that emit light, a top transparent layer 1106, as well as p-contact 1108 and n-contact 1110. In this embodiment, the ensemble 1104 includes an active region 1112 that comprises one or more QWs having a thickness greater than 4 nm, preferably a thickness of approximately 8-12 nm, and more preferably a thickness of approximately 10 nm.

Figure 12:
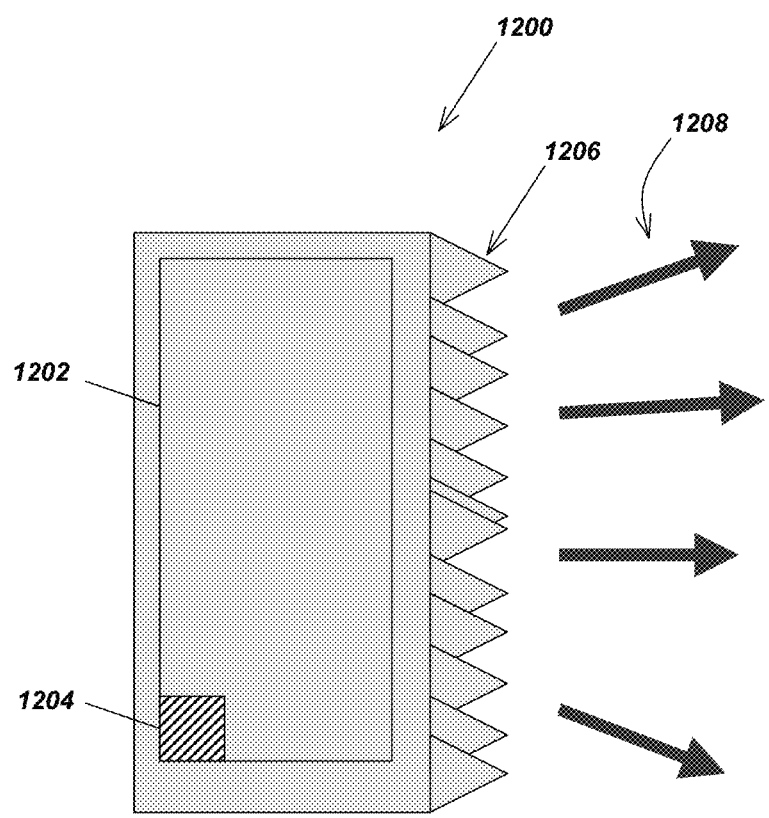
FIG. 12 is a schematic illustrating a top view of a side-emitting m-plane light emitting diode in accordance with the present invention.

FIG. 12 is a schematic illustrating another non-polar III-nitride light emitting device having a plurality of non-polar III-nitride layers comprising one or more p-type layers, an active region, and one or more n-type layers in accordance with the present invention. In this embodiment, the device is a top view of a side-emitting m-plane LED 1200, which includes a p-type electrode layer 1202, a metal p-type bonding pad 1204, and a roughened, textured, patterned or shaped surface 1206 to enhance the extraction of light 1208.

The p-type electrode layer 1202 is an electrically conductive transparent layer that may be roughened, textured, patterned or shaped. The p-type electrode layer 1202 is typically an ITO or ZnO layer, but can be other transparent metal oxides or other conductive materials which are substantially or completely transparent at the wavelengths of interest. The p-type electrode layer 1202 is formed adjacent the ensemble of non-polar III-nitride layers and covers substantially the entire top of the die. A current spreading layer may be deposited before the p-type electrode layer 1202, and a metal bonding pad 1204 is deposited on the p-type electrode layer 1202 and occupies a small portion of the p-type electrode layer 1202. The bulk of the emissions 1208 emanate from the side of the device 1200, although some emissions may exit through the p-type electrode layer 1202 as well.

Figure 13:
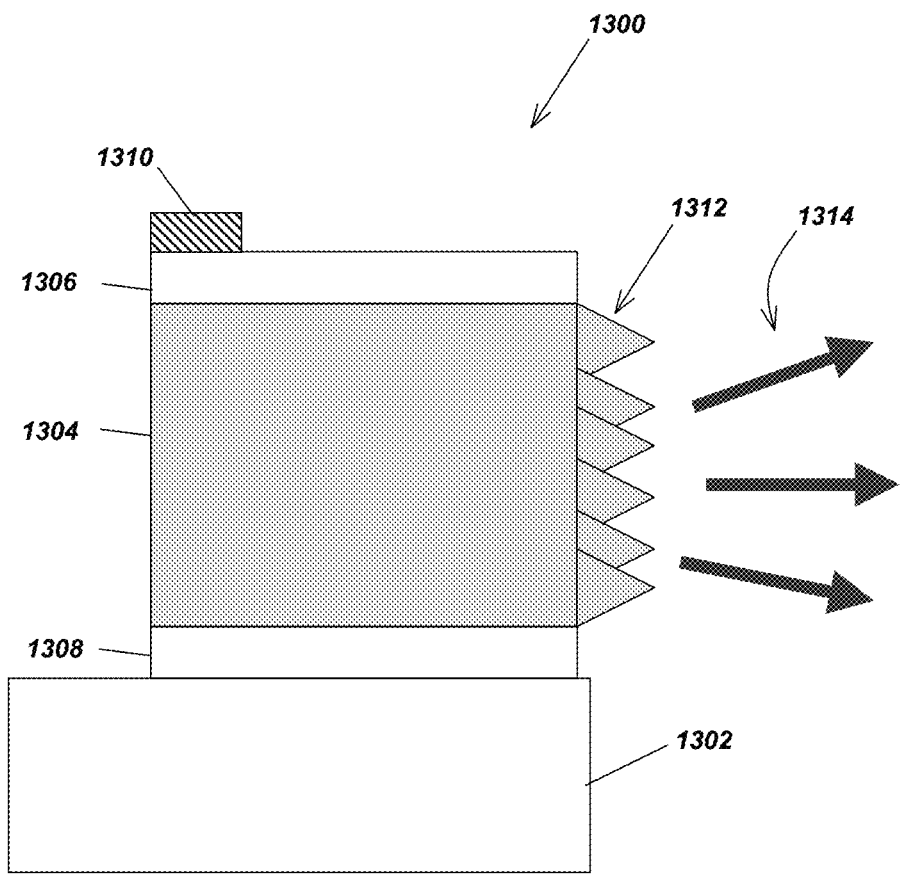
FIG. 13 is a schematic illustrating a side-emitting m-plane light emitting diode in accordance with the present invention.

FIG. 13 is a schematic illustrating another non-polar III-nitride light emitting device having a plurality of non-polar III-nitride layers comprising one or more p-type layers, an active region, and one or more n-type layers in accordance with the present invention. In this embodiment, the device is a side-emitting m-plane LED 1300, which includes a transparent conducting mount 1302, an ensemble 1304 of p-GaN/GaN/n-GaN layers that emit light, transparent electrode layers 1306, 1308 and p-contact 1310. This device 1300 also includes a roughened, textured, patterned or shaped surface 1312 to enhance the extraction of light 1314. Further, the device 1300 comprises a side-emitting device, with appropriate placement of contacts 1306, 1308. The device 1300 may be placed on a transparent mounting structure 1302, which is substantially or completely transparent at the wavelengths of interest, and is comprised of glass, epoxy, plastics, or other transparent materials.

Figure 14:
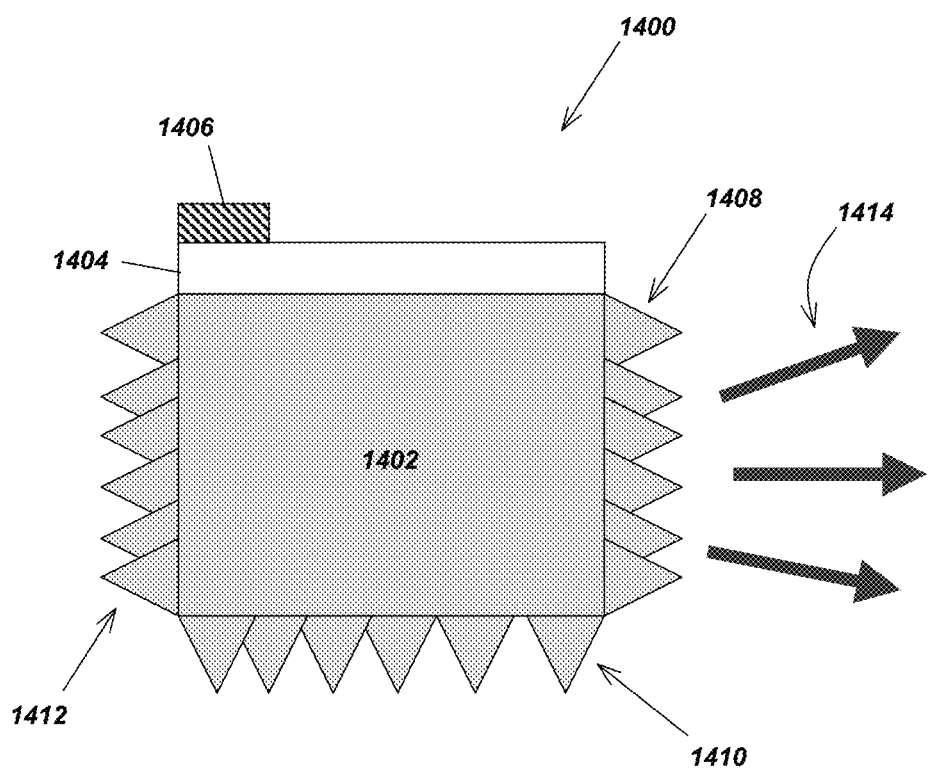
FIG. 14 is a schematic illustrating a shaped m-plane light emitting diode in accordance with the present invention.

FIG. 14 is a schematic illustrating another non-polar III-nitride light emitting device having a plurality of non-polar III-nitride layers comprising one or more p-type layers, an active region, and one or more n-type layers in accordance with the present invention. In this embodiment, the device is a shaped m-plane LED 1400, which includes a transparent lead frame (not shown), an ensemble 1402 of p-GaN/GaN/n-GaN layers that emit light, transparent electrode layer 1404 and p-contact 1406. Moreover, more than one emitting surface 1408, 1410, and 1412 of the device 1400 is roughened, textured, patterned or shaped to enhance the extraction of light 1414 from multiple facets of the device 1400 (although extraction from surface 1408 is the only one shown in FIG. 14).

Figure 15:
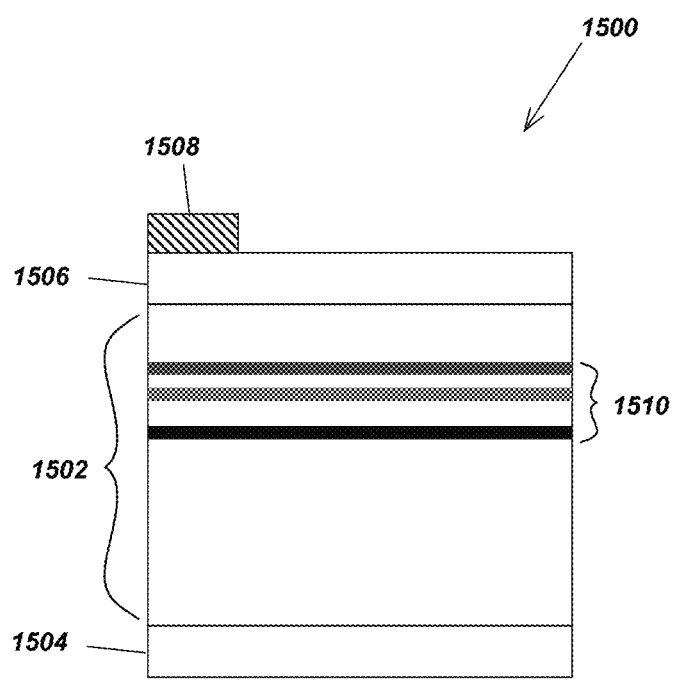
FIG. 15 is a schematic that illustrates a non-polar light emitting diode with multiple emitting layers that emits white light in accordance with the present invention.

FIG. 15 is a schematic illustrating another non-polar III-nitride light emitting device having a plurality of non-polar III-nitride layers comprising one or more p-type layers, an active region, and one or more n-type layers in accordance with the present invention. In this embodiment, the device is a non-polar LED 1500 with multiple emitting layers that emit white light. The non-polar LED 1500 includes an ensemble 1502 of p-GaN/GaN/n-GaN layers that emit light, transparent layers 1504, 1506, as well as p-contact 1508. In this embodiment, the ensemble 1502 includes an active region 1510, which can be a QW well layer if desired, comprised of multiple emitting layers emitting light at more than one wavelength. For example, the active region 1510 preferably emits at red, green, and blue wavelengths, which when combined, creates white light (or any other color of light). This is now possible because of the lack of interfering field-induced charge separations that are present in c-plane devices.

Figure 16:
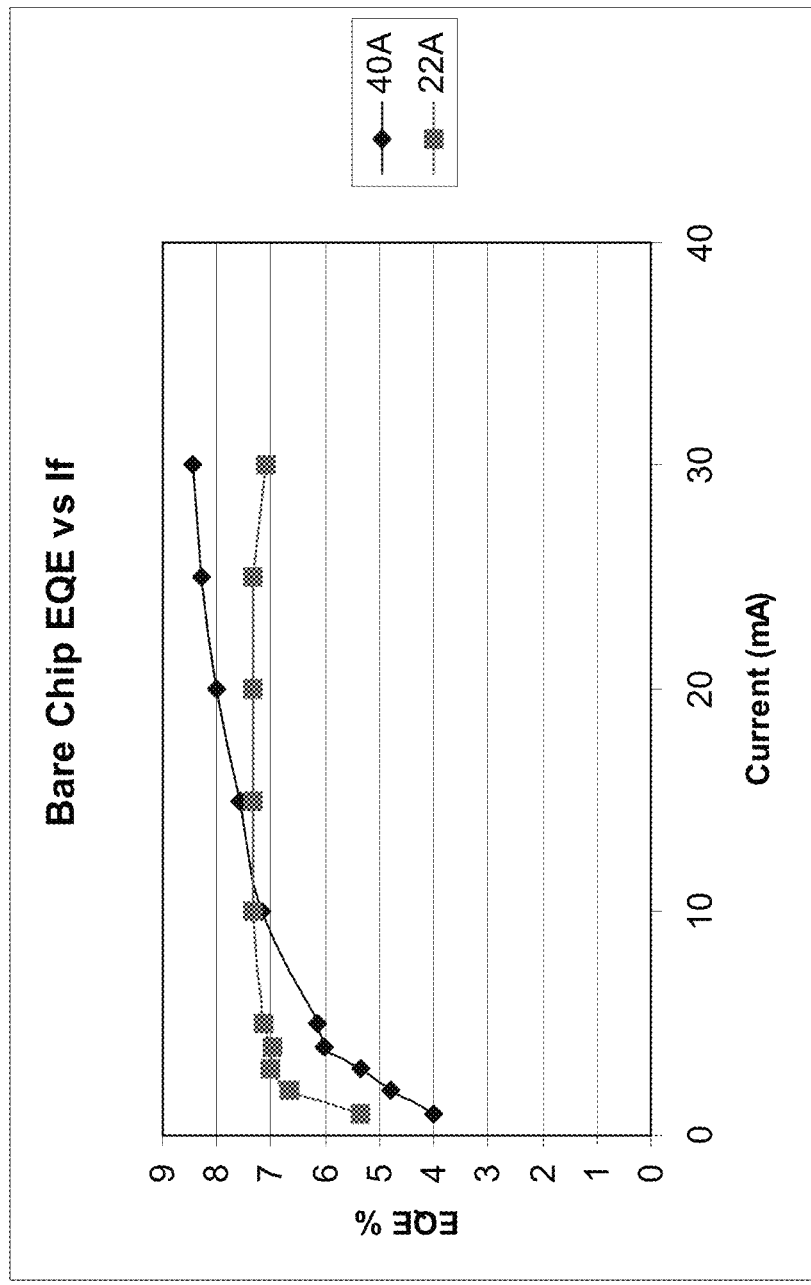
FIG. 16 is a graph that illustrates External Quantum Efficiency (EQE) percentage measurements vs. Current (mA) of the non-polar light emitting diodes of the present invention.

FIG. 16 is a graph that illustrates EQE percentage measurements vs. Current (mA) of the non-polar LEDs of the present invention. As seen, the non-polar LEDs of the present invention have a flattened EQE once the forward current reaches a threshold.

Figure 17:
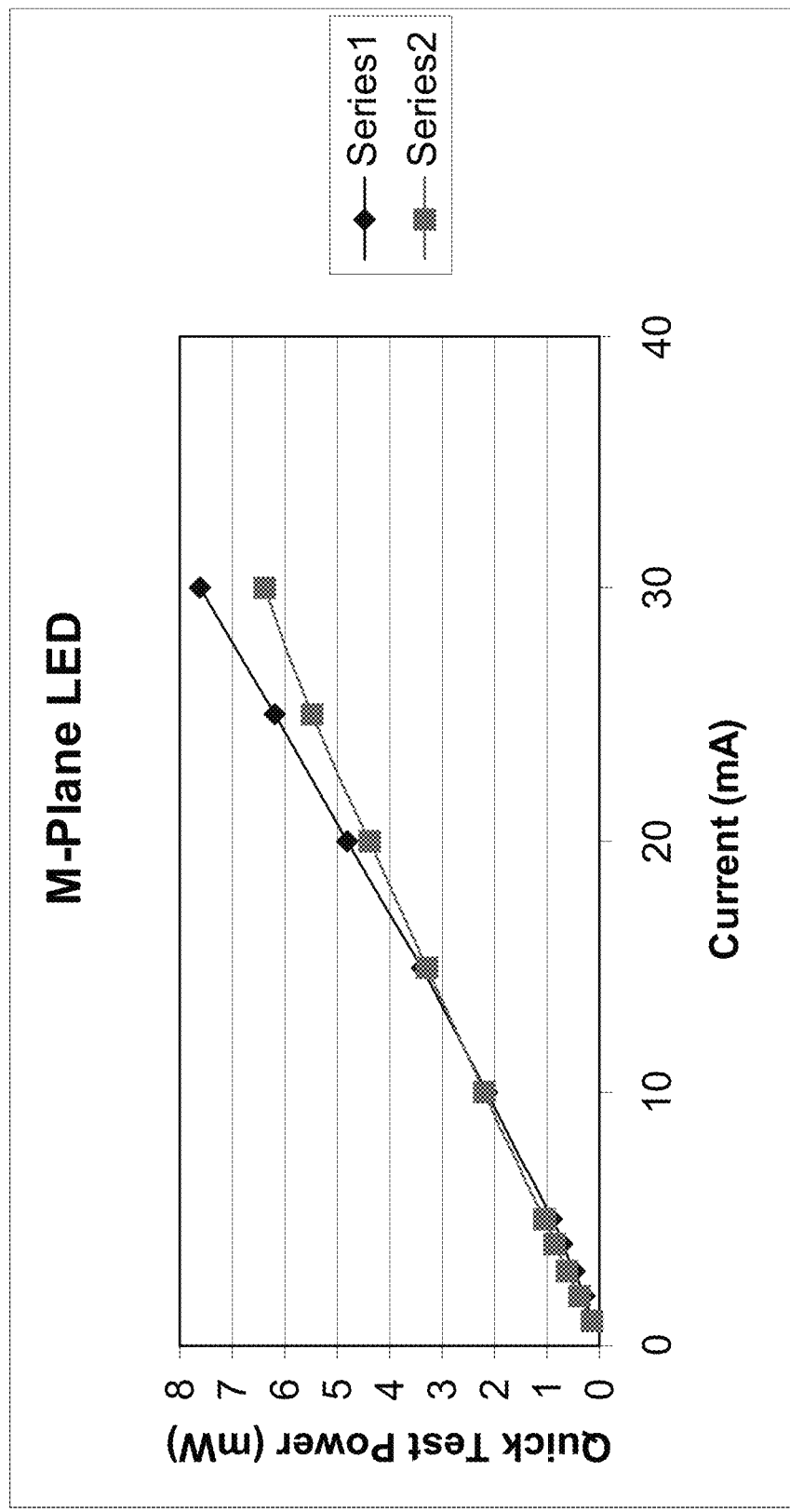
FIG. 17 is a graph that illustrates Quick Test Power (mW) vs. Current (mA) of the non-polar light emitting diodes of the present invention.

FIG. 17 is a graph that illustrates Quick Test Power (mV) vs. Current (mA) of the non-polar LEDs of the present invention. The power output shown is linear with respect to current input for m-plane LEDs of the present invention.

REFERENCES

The following references are incorporated by reference herein:
1. Appl. Phys. Lett. 56, 737-39 (1990).
2. Appl. Phys. Lett. 64, 2839-41 (1994).
3. Appl. Phys. Lett. 81, 3152-54 (2002).
4. Jpn. J. Appl. Phys., 43, L1275-77 (2004).
5. Jpn. J. Appl. Phys., 45, L1084-L1086 (2006).
6. Jpn. J. Appl. Phys., 34, L797-99 (1995).
7. Jpn. J. Appl. Phys., 43, L180-82 (2004).
8. Fujii T., Gao Y., Sharma R., Hu E. L., DenBaars S. P., Nakamura S., "Increase in the extraction efficiency of GaN-based light-emitting diodes via surface roughening," Appl. Phys. Lett., vol. 84, no. 6, 9 Febuary 2004, pp. 855-7.

CONCLUSION

Although discussed primarily with respect to m-plane gallium nitride, other non-polar and semi-polar geometries of gallium nitride and other related material systems can benefit from the present invention. Further, other materials that are used for other electronic devices or similar electronic devices, can also benefit from the present invention, such as Laser Diodes (LDs), High Electron Mobility Transistors (HEMTs), Vertical Cavity Side Emitting Lasers (VCSELs), solar cells, transistors, diodes, other emitting devices, and other devices fabricated using semiconductor processing techniques.

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching.

What is claimed is:

1. A III-nitride light emitting device, comprising:
   a plurality of III-nitride layers comprising at least one p-type layer, an active region, and at least one n-type layer,
   wherein the III-nitride layers are not c-plane III-nitride layers, and
   wherein the active region is comprised of at least one III-nitride quantum well layer having a thickness that achieves a current density such that light is emitted at an output power of at least 25 milliWatts (mW) when a current input at 20 milliAmps (mA) is applied.

2. The device of claim 1, wherein the at least one quantum well layer has a thickness of approximately 8-12 nanometers.

3. The device of claim 1, wherein the at least one quantum well layer has a thickness of approximately 10 nanometers.

4. The device of claim 1, wherein one or more emitting surfaces of the device is roughened, textured, patterned or shaped.

5. The device of claim 4, wherein more than one emitting surface of the device is roughened, textured, patterned or shaped.

6. The device of claim 4, wherein the emitting surface of the device is a cone shaped surface.

7. The device of claim 1, wherein the active region is comprised of multiple emitting layers emitting light at more than one wavelength.

8. The device of claim 1, further comprising a transparent electrode layer is formed adjacent the III-nitride layers.

9. The device of claim 8, wherein the transparent electrode layer is an electrically conductive contact layer.

10. The device of claim 8, wherein a surface of the transparent layer is roughened, textured, patterned or shaped.

11. The device of claim 8, wherein a current spreading layer is deposited before the transparent electrode layer.

12. The device of claim 1, wherein the device is placed on a transparent mounting structure.

13. The device of claim 1, wherein the active region includes at least one quantum well layer having a thickness greater than 5 nanometers to increase emitting efficiency as compared to non-polar or semi-polar III-nitride quantum well layers having a thickness of 5 nanometers or less and the light-emitting device has increased light emitting efficiency as the thickness is increased.

14. A method of fabricating a III-nitride light emitting device, comprising:
   forming a plurality of III-nitride layers comprising at least one p-type layer, an active region, and at least one n-type layer,
   wherein the III-nitride layers are not c-plane III-nitride layers, and
   wherein the active region is comprised of at least one III-nitride quantum well layer having a thickness that achieves a current density such that light is emitted at an output power of at least 25 milliWatts (mW) when a current input at 20 milliAmps (mA) is applied.

15. The method of claim 14, wherein the at least one quantum well layer has a thickness of approximately 8-12 nanometers.

16. The method of claim 14, wherein the at least one quantum well layer has a thickness of approximately 10 nanometers.

17. The method of claim 14, wherein one or more emitting surfaces of the device is roughened, textured, patterned or shaped.

18. The method of claim 17, wherein more than one emitting surface of the device is roughened, textured, patterned or shaped.

19. The method of claim 17, wherein the emitting surface of the device is a cone shaped surface.

20. The method of claim 14, wherein the active region is comprised of multiple emitting layers emitting light at more than one wavelength.

21. The method of claim 14, further comprising forming a transparent electrode layer adjacent the III-nitride layers.

22. The method of claim 21, wherein the transparent electrode layer is an electrically conductive contact layer.

23. The method of claim 21, wherein a surface of the transparent layer is roughened, textured, patterned or shaped.

24. The method of claim 21, wherein a current spreading layer is deposited before the transparent electrode layer.

25. The method of claim 14, wherein the device is placed on a transparent mounting structure.

26. The method of claim 14, wherein the active region includes at least one III-nitride quantum well layer having a thickness greater than 5 nanometers to increase emitting efficiency as compared to non-polar or semi-polar III-nitride quantum well layers having a thickness of 5 nanometers or less and the light-emitting device has increased light emitting efficiency as the thickness is increased.

* * * * *